(12) United States Patent
Lee et al.

(10) Patent No.: US 7,816,677 B2
(45) Date of Patent: Oct. 19, 2010

(54) ORGANIC LIGHT EMITTING DEVICE

(75) Inventors: Sung-Soo Lee, Suwon-si (KR); Jin-Koo Chung, Suwon-si (KR); Seong-Min Kim, Anyang-si (KR); Chang-Woong Chu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 167 days.

(21) Appl. No.: 12/112,292

(22) Filed: Apr. 30, 2008

(65) Prior Publication Data

US 2009/0200544 A1 Aug. 13, 2009

(30) Foreign Application Priority Data

Feb. 12, 2008 (KR) .................. 10-2008-0012623
Apr. 1, 2008 (KR) .................. 10-2008-0030437

(51) Int. Cl.
*H01L 35/24* (2006.01)
*H01L 51/00* (2006.01)
(52) U.S. Cl. .................. 257/40; 257/72; 313/503
(58) Field of Classification Search .................. 257/40, 257/72, E51.022, E21.158; 313/503, 504, 313/506
See application file for complete search history.

(56) References Cited

U.S. PATENT DOCUMENTS

| | | | |
|---|---|---|---|
| 2004/0156405 A1* | 8/2004 | Asai et al. ............. | 372/39 |
| 2005/0017630 A1* | 1/2005 | Ryu et al. ............. | 313/504 |
| 2008/0157664 A1* | 7/2008 | Cok ..................... | 313/506 |
| 2009/0206733 A1* | 8/2009 | Hwang et al. ......... | 313/504 |

* cited by examiner

*Primary Examiner*—Phuc T Dang
(74) *Attorney, Agent, or Firm*—H.C. Park & Associates, PLC

(57) ABSTRACT

An organic light emitting device includes first, second, and third pixels each displaying a different color. Each pixel includes a first electrode, a second electrode facing the first electrode, and an emission layer between the first and second electrodes. The first electrodes of the first and second pixels respectively include a first transparent conductive layer and a translucent conductive layer disposed on at least one of lower and upper portions of the first transparent conductive layer and forming microcavities together with the second electrodes, and the first electrode of the third pixel includes a second transparent conductive layer that is different from the first transparent conductive layer and a translucent conductive layer disposed on at least one of upper and lower portions of the second transparent conductive layer and forming a microcavity together with the second electrode.

17 Claims, 30 Drawing Sheets

FIG. 2

| B | W | B | W | B |
| G | R | G | R | G |
| B | W | B | W | B |
| G | R | G | R | G |
| B | W | B | W | B |

ORGANIC LIGHT EMITTING DEVICE

CROSS-REFERENCE TO RELATED APPLICATION

This application claims priority from and the benefit of Korean Patent Application Nos. 10-2008-0012623 and 10-2008-0030437 filed on Feb. 12, 2008, and Apr. 1, 2008, respectively, which are hereby incorporated by reference for all purposes as if fully set forth herein.

BACKGROUND OF THE INVENTION

1. Field of the Invention

The present invention relates to an organic light emitting device and a method of manufacturing the same.

2. Discussion of the Background

As the demand for lighter and thinner monitors and TVs increases, cathode ray tubes (CRTs) are being replaced by liquid crystal displays (LCDs).

However, LCDs are disadvantageous as light emitting and receiving devices in that they require a backlight and have many limitations with regard to response speed and viewing angle.

Recently, organic light emitting devices (OLEDs) have received much attention as display devices that can overcome such limitations.

An OLED includes two electrodes and an emission layer positioned therebetween. Electrons injected from one electrode and holes injected from the other electrode are combined in the emission layer to form exitons, and as the exitons discharge energy, the OLED is illuminated.

The OLED is a self-emission type of display that does not require a light source, so it may be advantageous in terms of power consumption and may comprise good response speed, viewing angle, and contrast ratio.

The OLED includes a plurality of pixels, such as red pixels, blue pixels, and green pixels, and full color can be expressed by combining the pixels.

In this case, the red pixel, the blue pixel, and the green pixel include a red emission layer, a blue emission layer, and a green emission layer, respectively, to express color. The emission layers may be deposited in each pixel using a fine shadow mask. However, as the size of the OLED increases, it becomes difficult to deposit the emission layer in each pixel using the fine shadow mask.

Thus, a technique in which the red emission layer, the blue emission layer, and the green emission layer are sequentially deposited on the entire OLED using an open mask to emit white light, and color filters are disposed at positions where the emitted light passes through to thus express red, green, and blue colors in each pixel, comprises been proposed.

However, the color filters generally comprise limited color reproducibility, so the light that passes through the color filters may have color reproducibility that is the same as or lower than the color reproducibility of the color filters. Thus, high color reproducibility, such as that required by the National Television Systems Committee (NTSC), may be difficult to achieve.

SUMMARY OF THE INVENTION

The present invention provides an OLED having improved color reproducibility, as well as a method of manufacturing the same.

Additional features of the invention will be set forth in the description which follows, and in part will be apparent from the description, or may be learned by practice of the invention.

The present invention discloses an OLED including first, second, and third pixels that each display a different color. Each pixel includes a first electrode, a second electrode facing the first electrode, and an emission layer positioned between the first and second electrodes. The first electrodes of the first and second pixels each include a first transparent conductive layer and a translucent conductive layer disposed on at least one of a lower portion and an upper portion of the first transparent conductive layer and forming microcavities together with the second electrodes, and the first electrode of the third pixel includes a second transparent conductive layer that is different from the first transparent conductive layer and a translucent conductive layer disposed on at least one of an upper portion and a lower portion of the second transparent conductive layer and forming a microcavity together with the second electrode.

The present invention also discloses a method of manufacturing an OLED including red, blue, and green pixels. The method includes forming a first electrode, forming an emission layer on the first electrode, and forming a second electrode on the emission layer. Forming the first electrode includes forming a translucent conductive layer in the red, blue, and green pixels, respectively, forming a first transparent conductive layer in at least one of the red, blue, and green pixels, and forming a second transparent conductive layer in the green pixel.

The present invention also discloses a method of manufacturing an OLED including red pixels, blue pixels, green pixels, and white pixels. The method includes forming thin film transistors (TFTs) on a substrate, forming a passivation layer on the TFTs, forming a layer on the passivation layer, patterning the passivation layer and the layer on the passivation layer to form a plurality of contact holes exposing the TFTs in the passivation layer and to form auxiliary layers positioned in each pixel, forming a first electrode on the auxiliary layers positioned in each pixel, forming an emission layer on the first electrode, and forming a second electrode on the emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 2 is a top plan view showing disposition of a plurality of pixels in the OLED according to an exemplary embodiment of the present invention.

DETAILED DESCRIPTION OF THE ILLUSTRATED EMBODIMENTS

Figure 1:
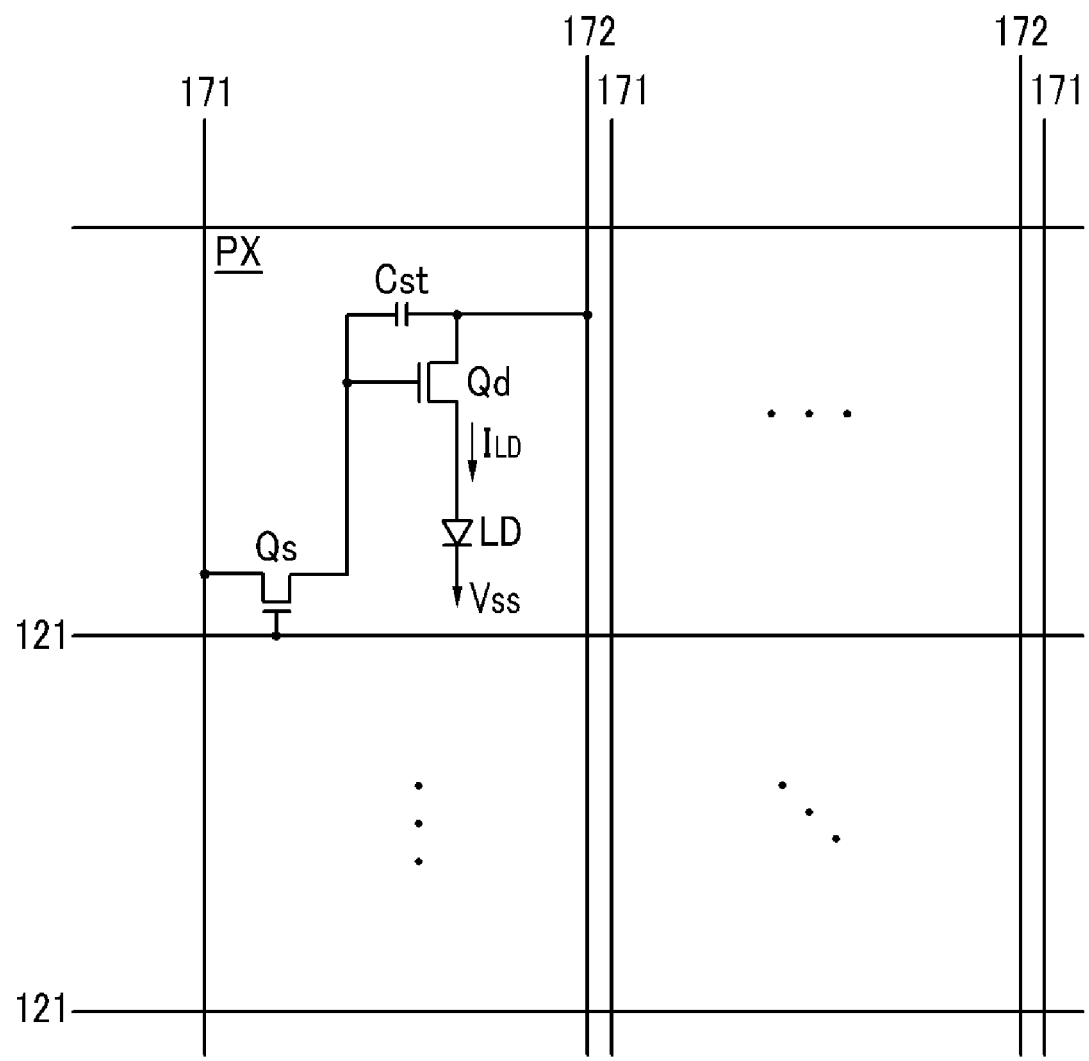
FIG. 1 is an equivalent circuit diagram of an OLED according to one exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Exemplary Embodiment 1

An OLED according to one exemplary embodiment of the present invention will now be described in detail with reference to FIG. 1.

FIG. 1 is an equivalent circuit diagram of an OLED according to one exemplary embodiment of the present invention.

Referring to FIG. 1, the OLED includes a plurality of signal lines 121, 171, and 172 and a plurality of pixels PX connected to the signal lines 121, 171, and 172 and arranged in a matrix form.

The signal lines include a plurality of gate lines 121 that transfer gate signals (or scan signals), a plurality of data lines 171 that transfer data signals, and a plurality of driving voltage lines 172 that transfer driving voltages. The gate lines 121 extend in a row direction and are parallel to each other, and the data lines 171 and the driving voltage lines 172 extend in a column direction and are parallel to each other.

Each pixel PX includes a switching thin film transistor (TFT) Qs, a driving TFT Qd, a storage capacitor Cst, and an organic light emitting diode LD.

The switching TFT Qs includes a control terminal, an input terminal, and an output terminal. The control terminal is connected to the gate line 121, the input terminal is connected to the data line 171, and the output terminal is connected to the driving TFT Qd. In response to a scan signal applied to the gate line 121, the switching TFT Qs transfers a data signal applied to the data line 171 to the driving TFT Qd.

The driving TFT Qd also includes a control terminal, an input terminal, and an output terminal. The control terminal is connected to the TFT Qs, the input terminal is connected to the driving voltage line 172, and the output terminal is connected to the organic light emitting diode LD. The driving TFT Qd provides an output current ILD with a magnitude that varies depending on the voltage between its control terminal and input terminal.

The capacitor Cst is connected between the control terminal and the input terminal of the driving transistor Qd. The capacitor Cst charges a voltage corresponding to a data signal applied to the control terminal of the driving TFT Qd and maintains it even after the switching transistor Qs is turned off.

The organic light emitting diode LD includes an anode connected to the output terminal of the driving TFT Qd and a cathode connected to a common voltage Vss. The organic light emitting diode LD is illuminated with an intensity that changes according to the output current ILD of the driving TFT Qd, to display an image.

The switching TFT Qs and the driving TFT Qd are n-channel electric field effect transistors (FETs). Alternatively, at least one of the switching TFT Qs and the driving TFT Qd may be a p-channel FET. The connection relationship among the TFTs Qs and Qd, the capacitor Cst, and the organic light emitting diode LD may change.

The OLED shown in FIG. 1 will be described with reference to FIG. 2.

Figure 2:
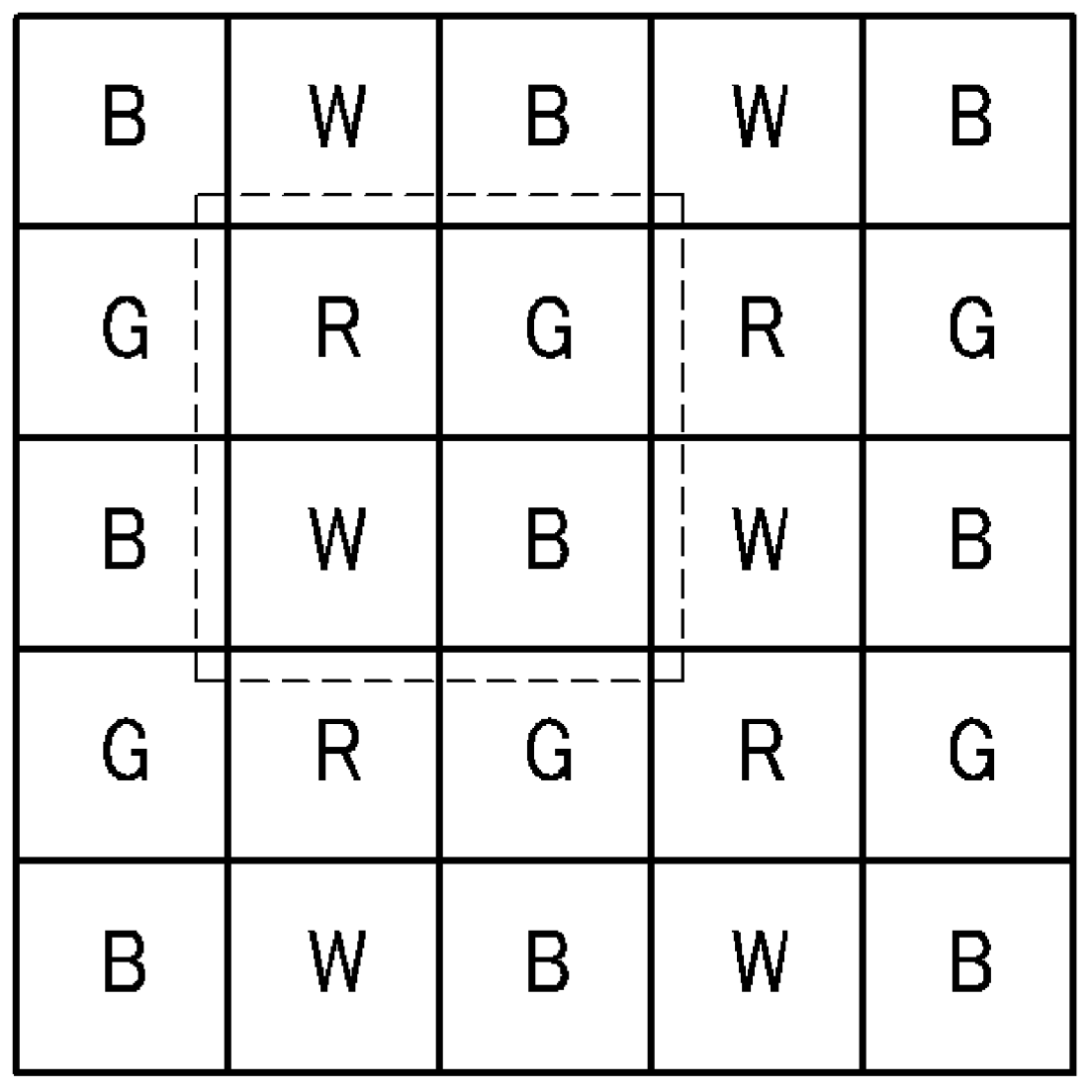

FIG. 2 is a top plan view showing disposition of a plurality of pixels in an OLED according to one exemplary embodiment of the present invention.

With reference to FIG. 2, the OLED according to one exemplary embodiment of the present invention include red pixels R that display red color, green pixels G that display green color, blue pixels B that display blue color, and white pixels W. The red pixel R, the green pixel G, and the blue pixel B are basic pixels for expressing full colors, and the luminance may be enhanced by including the white pixel W.

The four pixels including the red pixel R, the green pixel G, the blue pixel B, and the white pixel W may be grouped and repeated in rows or columns. The disposition of the pixels may vary.

The red pixel R, the blue pixel B, and the green pixel G may have a microcavity structure, while the white pixel W may have a different structure.

A detailed structure of the OLED shown in FIG. 2 will now be described with reference to FIG. 3.

Figure 3:
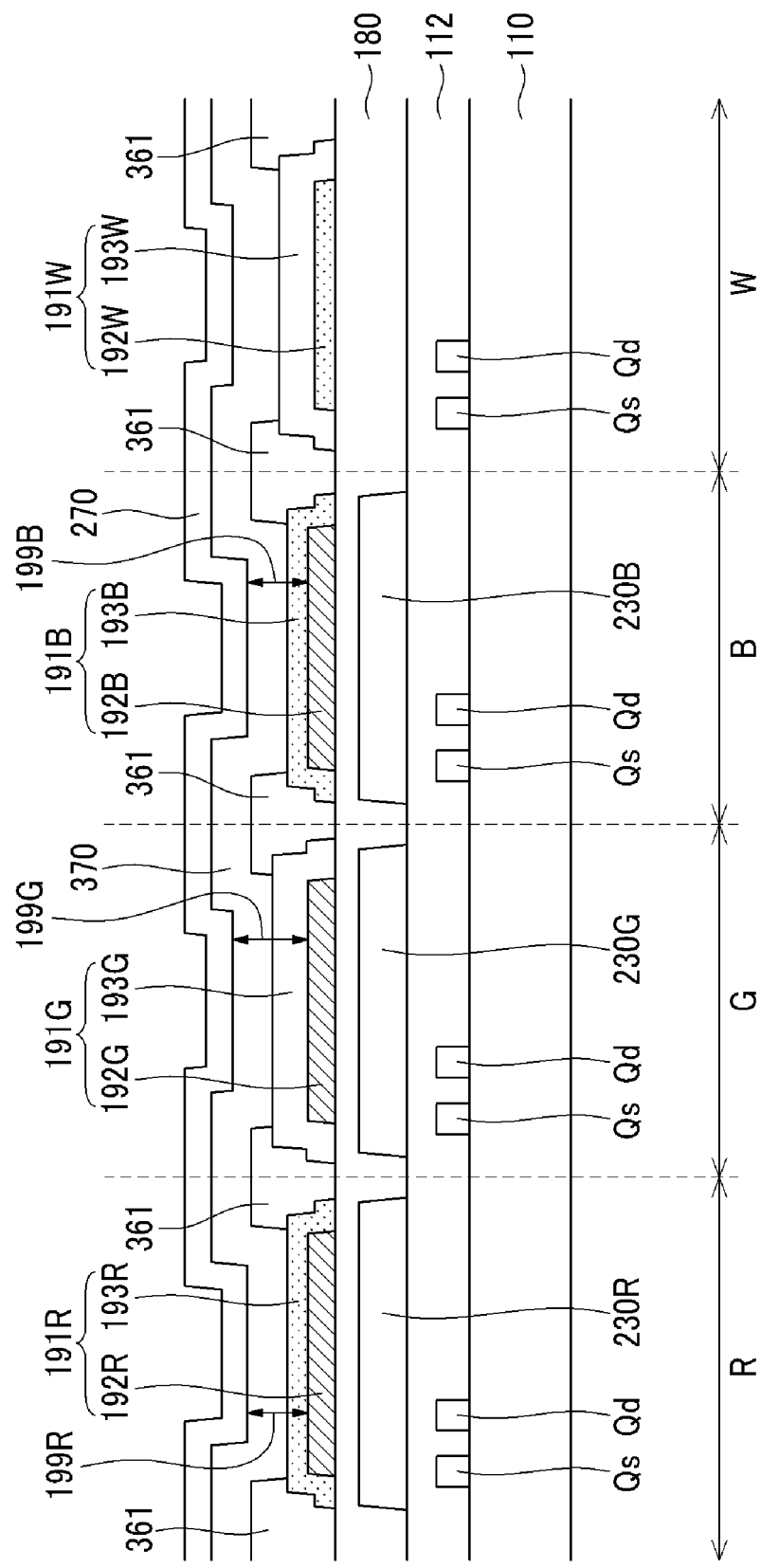
FIG. 3 is a cross-sectional view showing the structure of an OLED according to one exemplary embodiment of the present invention.

FIG. 3 is a cross-sectional view showing the structure of an OLED according to one exemplary embodiment of the present invention.

A plurality of TFT arrays are arranged on an insulation substrate 110. A TFT array includes a switching TFT Qs and a driving TFT Qd and is disposed in each pixel. The switching TFT Qs and the driving TFT Qd may be connected to each other as shown in FIG. 1.

A passivation layer 112 is disposed on the TFT arrays. The passivation layer 112 includes a plurality of contact holes (not shown) that expose portions of the switching TFTs Qs and the driving TFTs Qd.

Red filters 230R, green filters 230G, and blue filters 230B are disposed on the passivation layer 112, respectively, at the red pixels R, the green pixels G, and the blue pixels B. Either no color filters or transparent white filters (not shown) may be disposed in the white pixels W. The color filters 230R, 230G, and 230B may be disposed according to a color filter on array method.

An overcoat layer 180 is disposed on the color filters 230R, 230G, and 230B and on the passivation layer 112. The overcoat layer 180 includes a plurality of contact holes (not shown).

Pixel electrodes 191R, 191G, 191B, and 191W are disposed on the overcoat layer 180. The pixel electrodes 191R, 191G, 191B, and 191W are connected to the driving TFTs Qd via contact holes (not shown), and may serve as anodes.

The pixel electrodes 191R, 191G, 191B, and 191W of the respective pixels may have different structures.

Each pixel electrode 191R of the red pixels R may be a dual-layered structure including a translucent conductive layer 192R and a first transparent conductive layer 193R, and each pixel electrode 191B of the blue pixels B may also be a dual-layered structure including a translucent conductive layer 192B and a first transparent conductive layer 193B.

Each pixel electrode 191G of the green pixels G may be a dual-layered structure including a translucent conductive layer 192G and a second transparent conductive layer 193G.

Each pixel electrode 191W of the white pixels W may be a dual-layered structure including a first transparent conductive layer 192W and a second transparent conductive layer 193W.

The translucent conductive layers 192R, 192B, and 192G disposed in the red pixel R, the blue pixel B, and the green pixel G may be made of a material having properties that allow portions of light to be transmitted therethrough while other portions of light are reflected thereon, such as silver (Ag), aluminum (Al), gold (Au), nickel (Ni), magnesium (Mg), their alloys, etc., with a thickness of about 100 Å to 400 Å. The translucent conductive layers 192R, 192B, and 192G form microcavity structures 199R, 199B, and 199G together with a common electrode 270, which will be described below.

The first transparent conductive layers 193R, 193B, and 192W and the second transparent conductive layers 193G and 193W may be made of a transparent conductive oxide, such as ITO, IZO, ZnO, etc., and in this case, the first transparent conductive layers 193R, 193B, and 192W, and the second transparent conductive layers 193G and 193W may have different etching ratios. For example, if the first transparent conductive layers 193R, 193B, and 192W are made of crystalline ITO, the second transparent conductive layers 193G and 193W may be made of IZO, ZnO, or amorphous ITO. The first transparent conductive layers 193R, 193B, and 192W, and the second transparent conductive layers 193G and 193W, may have a thickness of about 100 Å to 500 Å and about 400 Å to 1,000 Å, respectively, and the second transparent conductive layers 193G and 193W may be thicker than the first transparent conductive layers 193R and 193B.

A plurality of insulation members 361 that define each pixel are disposed on the pixel electrodes 191R, 191B, 191G, and 191W, and an organic light emitting member is disposed on the plurality of insulation members 361 and on the pixel electrodes 191R, 191B, 191G, and 191W.

The organic light emitting member may include an organic emission layer 370 and an accessory (appendant) layer (not shown) that may improve the luminous efficiency of the organic emission layer 370.

As the organic emission layer 370, a plurality of sub-emission layers (not shown) may be formed by sequentially depositing materials, each of which uniquely manifests red, green, and blue light, and the colors of the materials may be combined to emit white light. The sub-emission layers may be arranged horizontally or vertically and various colors, other than the red, green, blue colors, may be combined so long as they can manifest white light.

The accessory layer may be one or more of an electron transport layer, a hole transport layer, an electron injecting layer, and a hole injecting layer.

The common electrode 270 is disposed on the organic light emitting member. The common electrode 270 may be made of metal having a high reflection factor, and serves as a cathode. The common electrode 270 is disposed on the entire surface of the substrate 110, and pairs with each pixel electrode 191R, 191B, 191G, and 191W, which serve as an anode, to provide current to the organic emission layer 370.

In this manner, in the exemplary embodiment of the present invention, the translucent conductive layers 192R, 192B, and 192G disposed in the red pixel R, the blue pixel B, and the green pixel G, respectively, form the microcavity structures 199R, 199B, and 199G together with the common electrode 270.

The microcavity structure refers to a structure in which light is repeatedly reflected between a reflective layer and a translucent layer that are spaced apart by an optical length to amplify light of a particular wavelength through constructive interference. Here, the common electrode 270 serves as the reflective layer, and the translucent conductive layers 192R, 192B, and 192G serve as the translucent layer.

The common electrode 270 considerably modifies the illumination characteristics of light emitted by the organic emission layer 370. Of the modified light, light near the wavelength corresponding to a resonance wavelength of the microcavity is strengthened by the translucent conductive layer 192R, 192B, and 192G, and light of other wavelengths is suppressed.

A wavelength range of light strengthened in the microcavity structures 199R, 199B, and 199G may be determined depending on the length of an optical path. The length of an optical path is the distance between the common electrode 270 and the translucent conductive layers 192R, 192B, and 192G, so the optical length of each pixel may be determined by the thicknesses of the emission layer 370 and the pixel electrodes 191R, 191G, and 191B. Because the emission layer 370 is disposed on the entire surface under the same deposition conditions, it may be assumed that the thickness of the emission layer 370 is uniform. In addition, because the translucent conductive layers 192R, 192B, and 192G are also deposited under the same deposition conditions and the same photolithography conditions in the red pixel R, the green pixel G, and the blue pixel B, it may be assumed that the translucent conductive layers 192R, 192B, and 192G have uniform thickness. Thus, the length of the optical path may be adjusted by adjusting the thickness of the first transparent conductive layers 193R and 193B and the second transparent conductive layer 193G of the pixel electrodes 191R, 191B, and 191G, respectively.

In this exemplary embodiment, the red pixel R and the blue pixel B include the first transparent conductive layer 193R and 193B, each having a thickness of about 100 Å to 500 Å, disposed on the translucent conductive layers 192R and 192B, respectively, and the green pixel G includes the second transparent conductive layer 193G having a thickness of about 400 Å to 1000 Å disposed on the translucent conductive layer 192G. Because the second transparent conductive layer 193G is thicker than the first transparent conductive layers 193R and 193B, the optical path of the green pixel G is longer than that of the red pixel R and the blue pixel B.

This will now be described with reference to FIG. 29 and FIG. 30.

Figure 29:
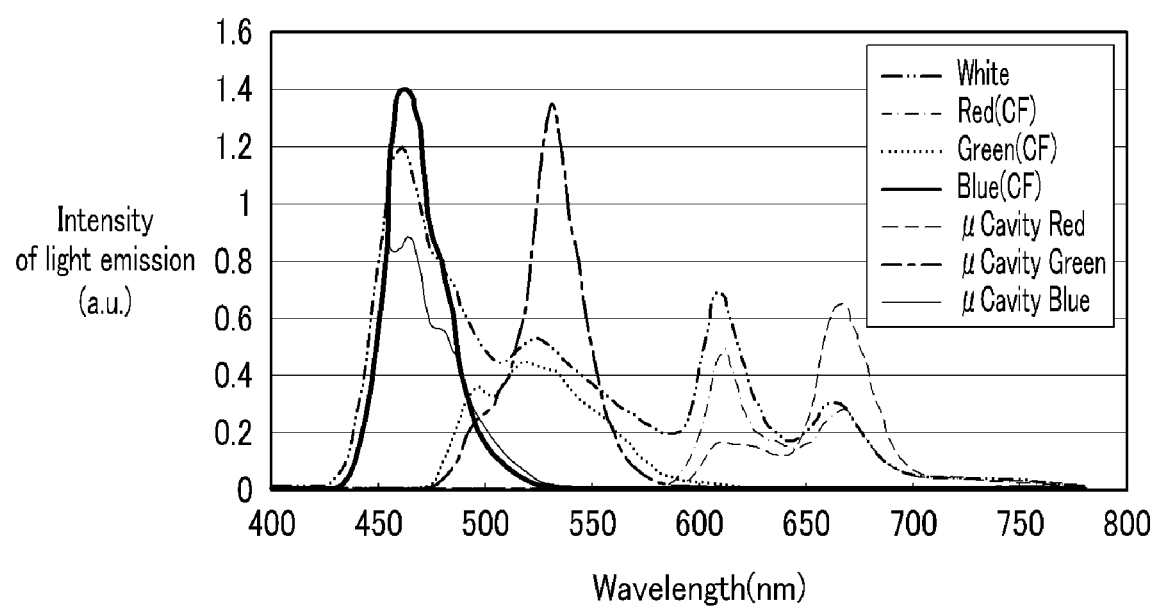
FIG. 29 is a graph showing an emission spectrum of an OLED according to an exemplary embodiment of the present invention.
Figure 30:
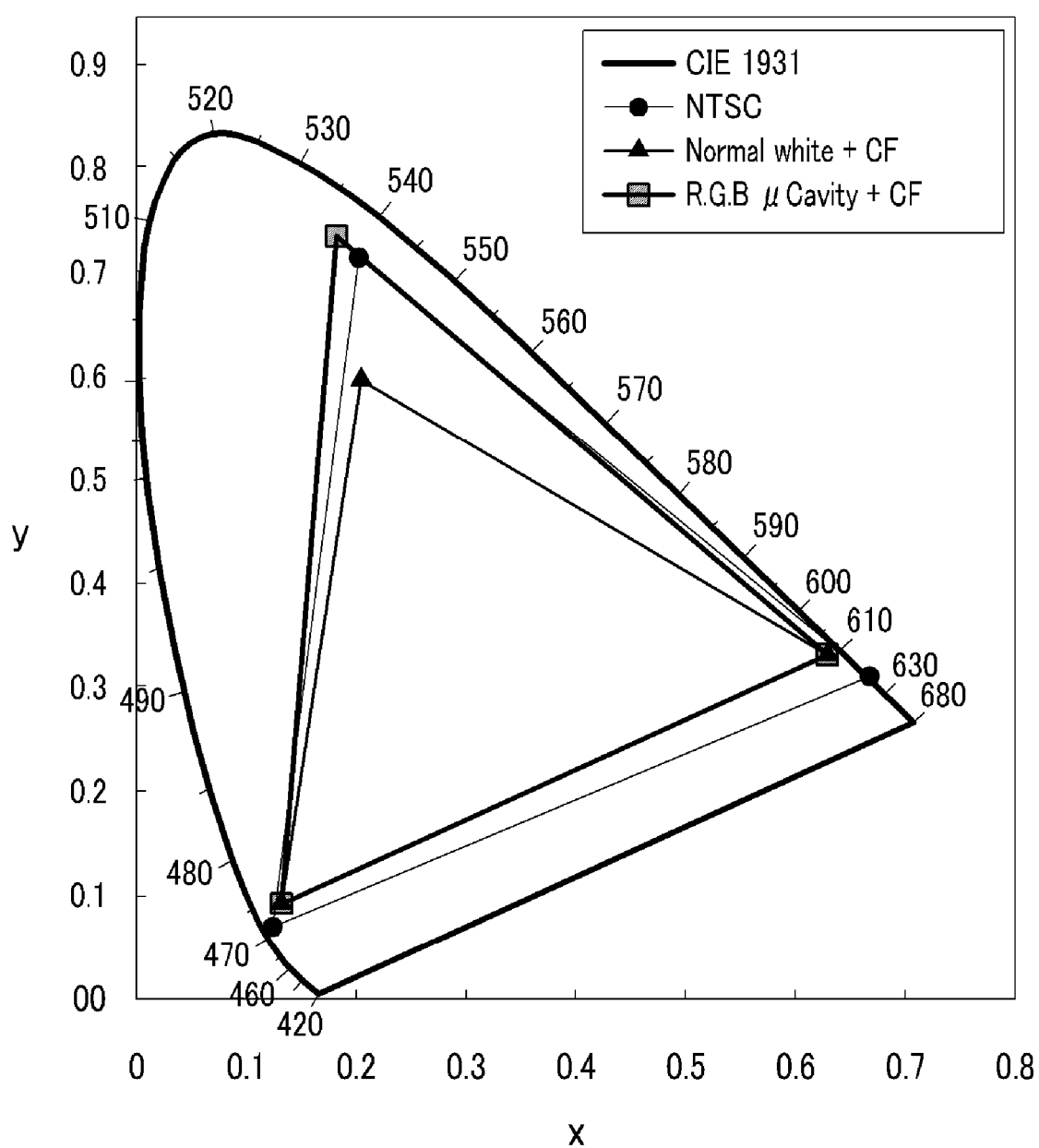
FIG. 30 is a graph of color coordinates showing color reproducibility of an OLED according to an exemplary embodiment of the present invention.

FIG. 29 is a graph showing an emission spectrum of an OLED according to one exemplary embodiment of the present invention, and FIG. 30 is a graph of color coordinates showing color reproducibility of an OLED according to an exemplary embodiment of the present invention.

With reference to FIG. 29, white light emitted from the emission layer 370 exhibits an emission spectrum having peaks near about 460 nm (blue region), near about 530 nm (green region), and near about 610 nm (red region). Of them, the spectrum of the green region extends in a wide wavelength range and overlaps the spectrum of a long wavelength of the blue region, so their boundary is not clear. In addition, the spectrum of the green region has very low light emission intensity.

When white light (White) passes through a color filter, the green emission spectrum transmits through the emission spectrum of the long wavelength of blue color, so color purity of green color may be drastically degraded (see Green(CF) of FIG. 29). In addition, it is noted that color purity of the blue emission spectrum (Blue(CF)) that has passed through a blue filter and that of the red emission spectrum (Red(CF)) that has passed through a red filter are degraded compared with the spectrum of white light (White). This is because, if the color purity of white light at each wavelength region is 100%, the color filters have lower color purity than the white light at each wavelength region, so light that has passed through the color filters may have color reproducibility that is the same as or lower than the color filters.

In this exemplary embodiment, the red pixel R, the blue pixel B, and the green pixel G each have the microcavity structure, which may provide high color reproducibility and overcome the limitation of the color filters. In addition, the length of microcavity of the green pixel G may be uniquely set to be different from those of the red pixel R and the blue pixel B in order to amplify light of the green wavelength region, which has the relatively weak peak.

With reference to FIG. 29, it can be ascertained that in the structure of the red pixel R, the blue pixel B, and the green pixel G having the microcavity structure according to the exemplary embodiment of the present invention, the red region (μCavity Red), the green region (μCavity Green), and the blue region (μ Cavity Blue) exhibit higher intensity of light emission at narrow wavelength ranges. Having the peaks at narrow wavelength ranges suggests that the color purity and color reproducibility have been improved, and the high intensity of light emission suggests that light efficiency has been improved.

In particular, the green emission spectrum having the narrow wavelength range had a unique microcavity length that was set to be suitable for the green wavelength region, different from those of the red and blue regions, and was obtained by strengthening light of the narrow wavelength region of about 520 nm to 550 nm and suppressing light of the other wavelength regions. Because this green emission spectrum does not overlap with the long wavelength of the blue emission spectrum, the color purity and color reproducibility of the green color was improved.

Referring to FIG. 30, assuming that an NTSC region has 100% color reproducibility, it was noted that the structure having the microcavities in the red pixel R, the green pixel G, and the blue pixel B has high color reproducibility of about 108.5%. This means that the color reproducibility is remarkably improved as compared with the case where a structure has only white color emission (Normal white) and a color filter (CF) without a microcavity, which has about 72% color reproducibility.

As for the white pixel W, the first transparent conductive layer 192W and the second transparent conductive layer 193W are sequentially deposited without a microcavity structure to allow light emitted from the emission layer to be transmitted therethrough unaltered.

A method of manufacturing OLED of FIG. 3 will now be described with reference to FIG. 4, FIG. 5, FIG. 6, FIG. 7, FIG. 8, FIG. 9, FIG. 10, FIG. 11, FIG. 12, and FIG. 13.

FIG. 4, FIG. 5, FIG. 6, FIG. 7, FIG. 8, FIG. 9, FIG. 10, FIG. 11, FIG. 12, and FIG. 13 are cross-sectional views sequentially showing a method of manufacturing the OLED in FIG. 3 according to one exemplary embodiment of the present invention.

Figure 4:
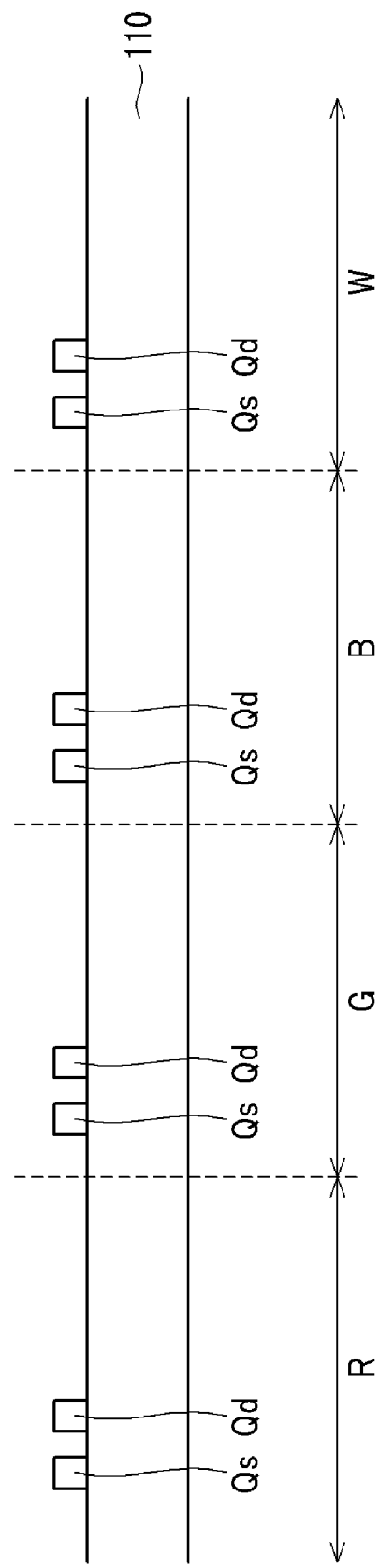
FIG. 4, FIG. 5, FIG. 6, FIG. 7, FIG. 8, FIG. 9, FIG. 10, FIG. 11, FIG. 12, and FIG. 13 are cross-sectional views sequentially showing a method of manufacturing the OLED in FIG. 3 according to one exemplary embodiment of the present invention.

With reference to FIG. 4, a plurality of switching TFTs Qs and a plurality of driving TFTs Qd are formed on the insulation substrate 110. Here, the forming of the switching TFTs Qs and the driving TFTs Qd includes forming and patterning a conductive layer, an insulating layer, and a semiconductor layer.

Figure 5:
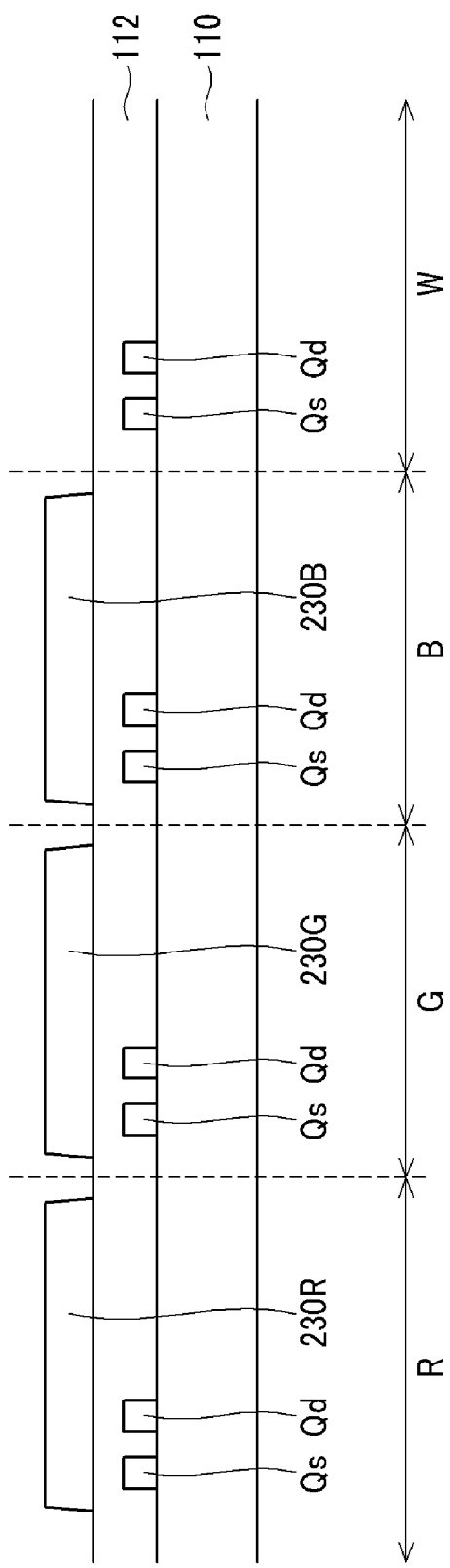

Next, with reference to FIG. 5, the passivation layer 112 is formed on the switching TFTs Qs and the driving TFTs Qd and is then patterned to form a plurality of contact holes (not shown).

Subsequently, a plurality of color filters 230R, 230G, and 230B are formed on the passivation layer 112.

Figure 6:
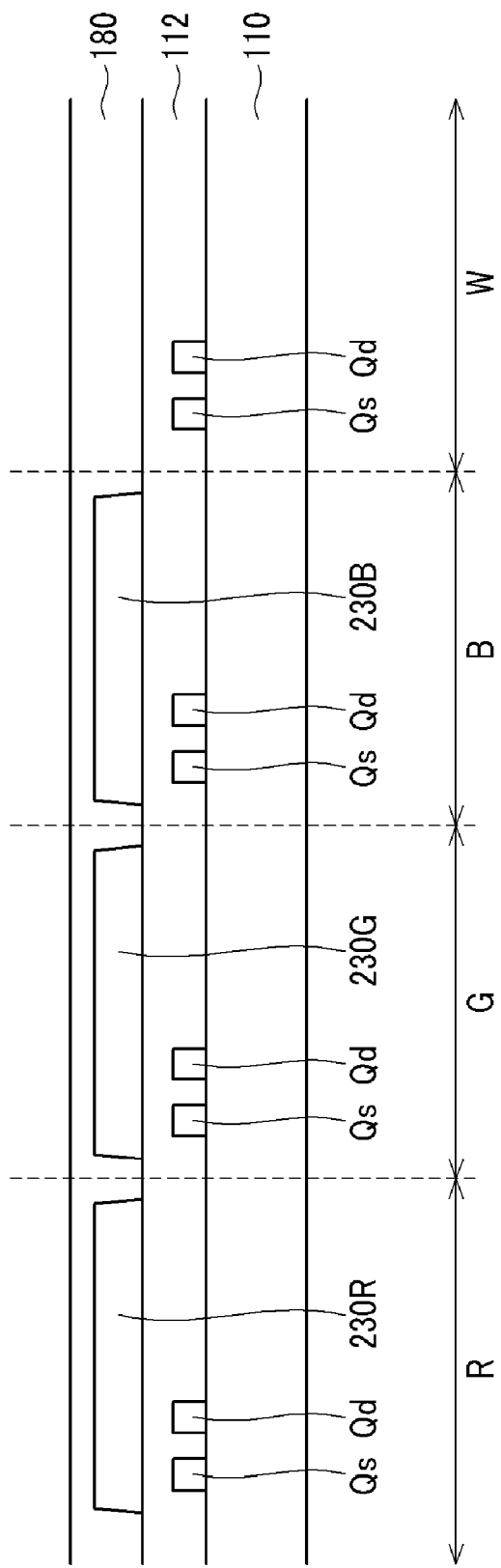

Then, as shown in FIG. 6, the overcoat layer 180 is formed on the passivation layer 112 and on the color filters 230R, 230G, and 230B, and then is patterned to form a plurality of contact holes (not shown).

Figure 7:
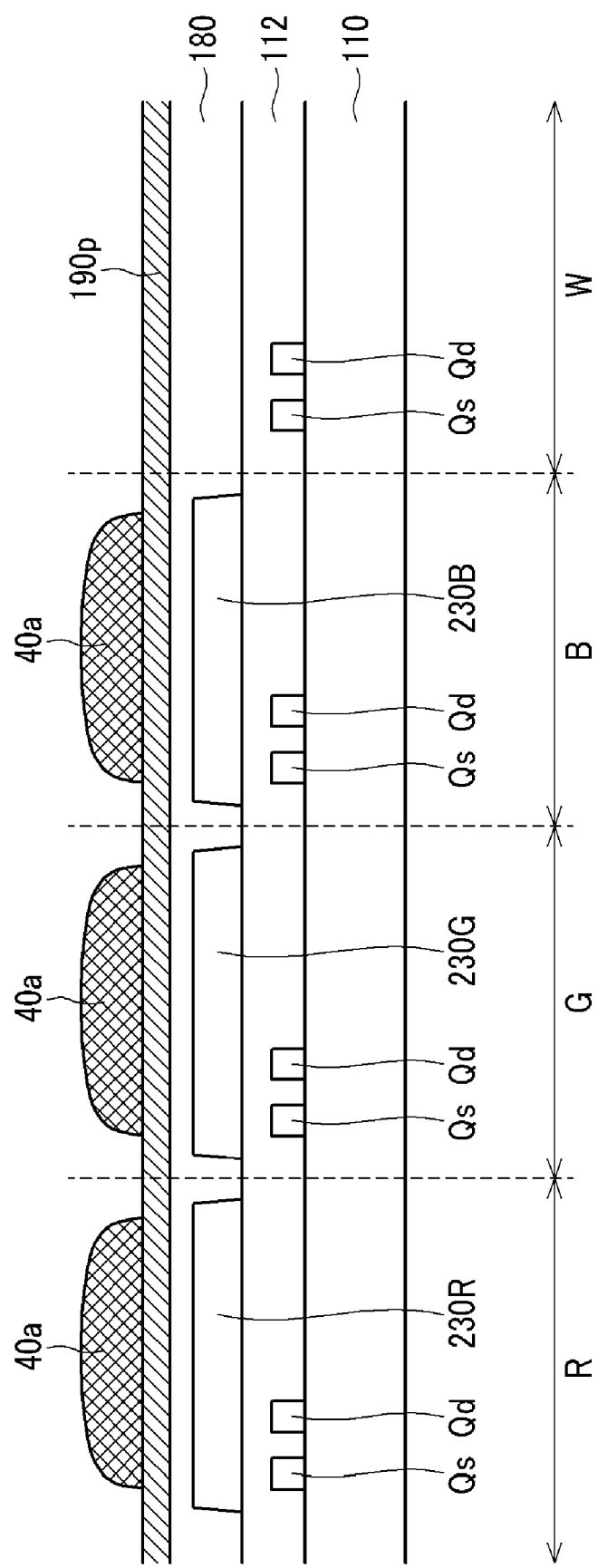

Thereafter, as shown in FIG. 7, a lower conductive layer 190p is formed on the overcoat layer 180. The lower conductive layer 190p may be made of silver (Ag), aluminum (Al), gold (Au), nickel (Ni), magnesium (Mg), their alloys, etc., and may be formed to have a thickness of about 100 Å to 400 Å.

Subsequently, a first photosensitive film (not shown) is coated on the lower conductive layer 190p and then patterned to form first photosensitive patterns 40a in each of the red pixels R, the green pixels G, and the blue pixels B.

Figure 8:
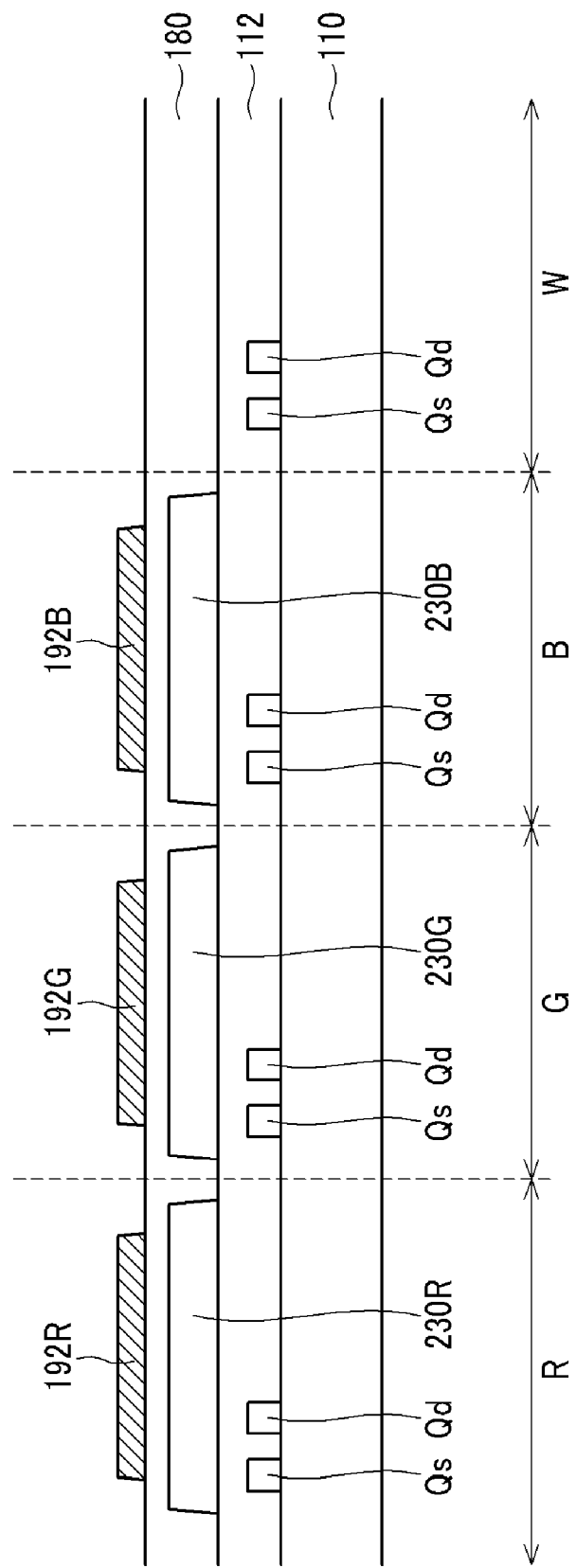

Referring to FIG. 7 and FIG. 8, a photolithography process is performed on the lower conductive layer 190p using the first photosensitive patterns 40a to form the translucent conductive layers 192R, 192G, and 192B in the red pixels R, the green pixels G, and the blue pixels B, respectively.

Figure 9:
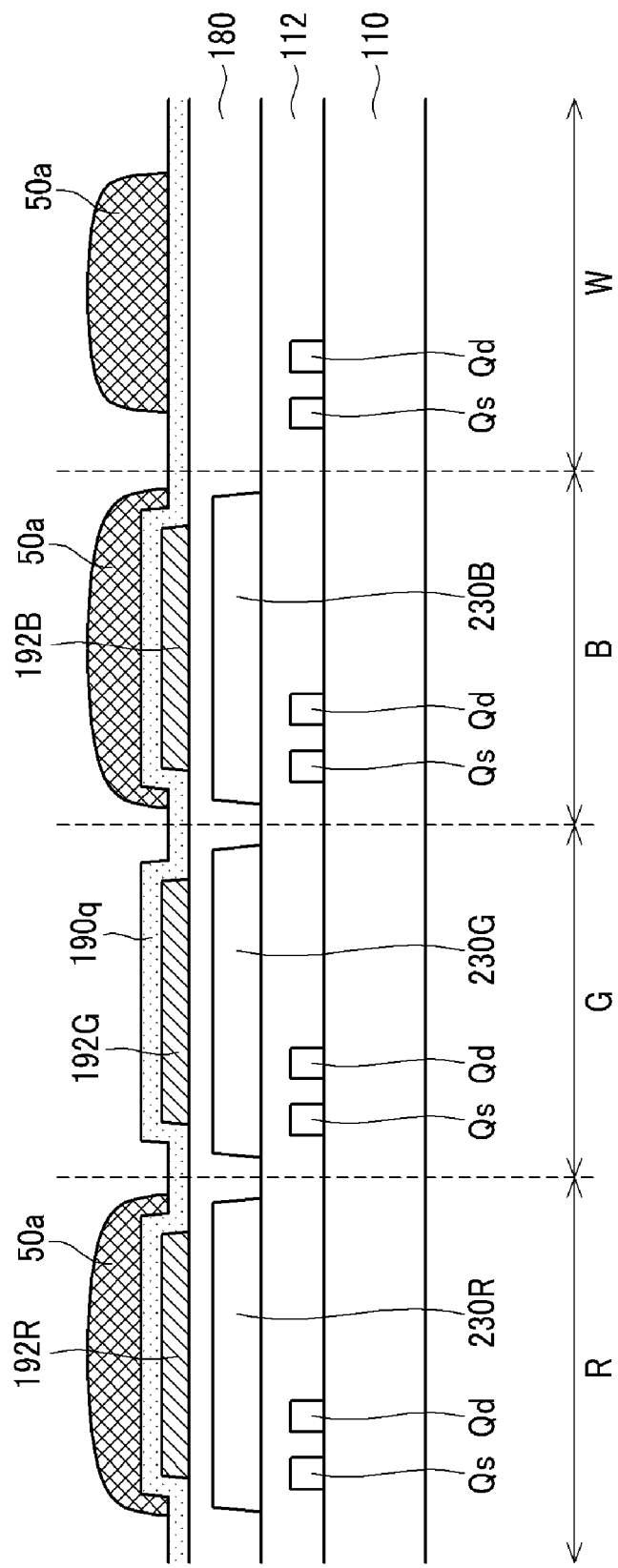

With reference to FIG. 9, an intermediate conductive layer 190q is formed on the translucent conductive layers 192R, 192G, and 192B and on the overcoat layer 180. The intermediate conductive layer 190q is formed by depositing ITO at about 200° C. to 400° C.

Subsequently, a second photosensitive film (not shown) is coated on the intermediate conductive layer 190q and then patterned to form second photosensitive patterns 50a at the red pixels R, the blue pixels B, and the white pixels W.

Figure 10:
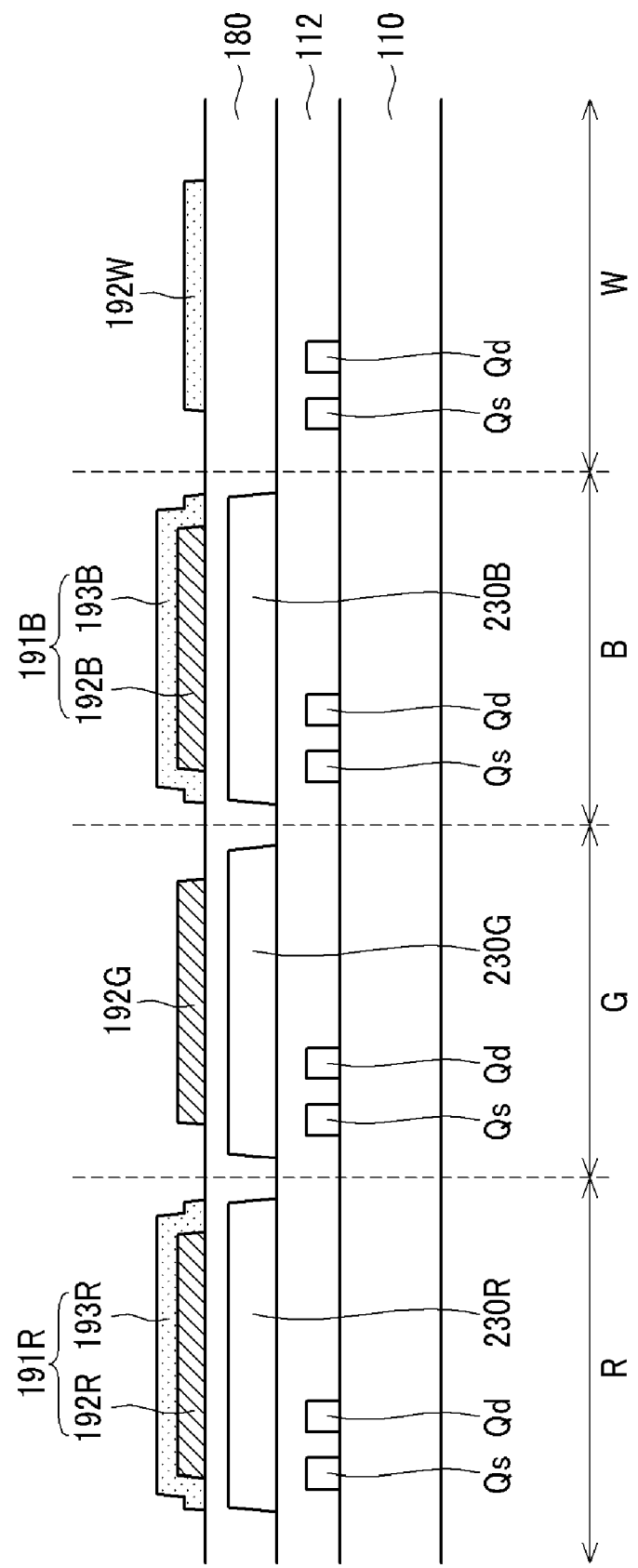

With reference to FIG. 9 and FIG. 10, a photolithography process is performed on the intermediate conductive layer 190q using the second photosensitive patterns 50a to form the first transparent conductive layers 193R, 193B, and 192W in the red pixels R, the blue pixels B, and the white pixels W, respectively.

The translucent conductive layers 192R and the first transparent conductive layers 193R form the pixel electrodes 191R in the red pixels R, and the translucent conductive layers 192B and the first transparent conductive layers 193B form the pixel electrodes 191B in the blue pixels B.

Figure 11:
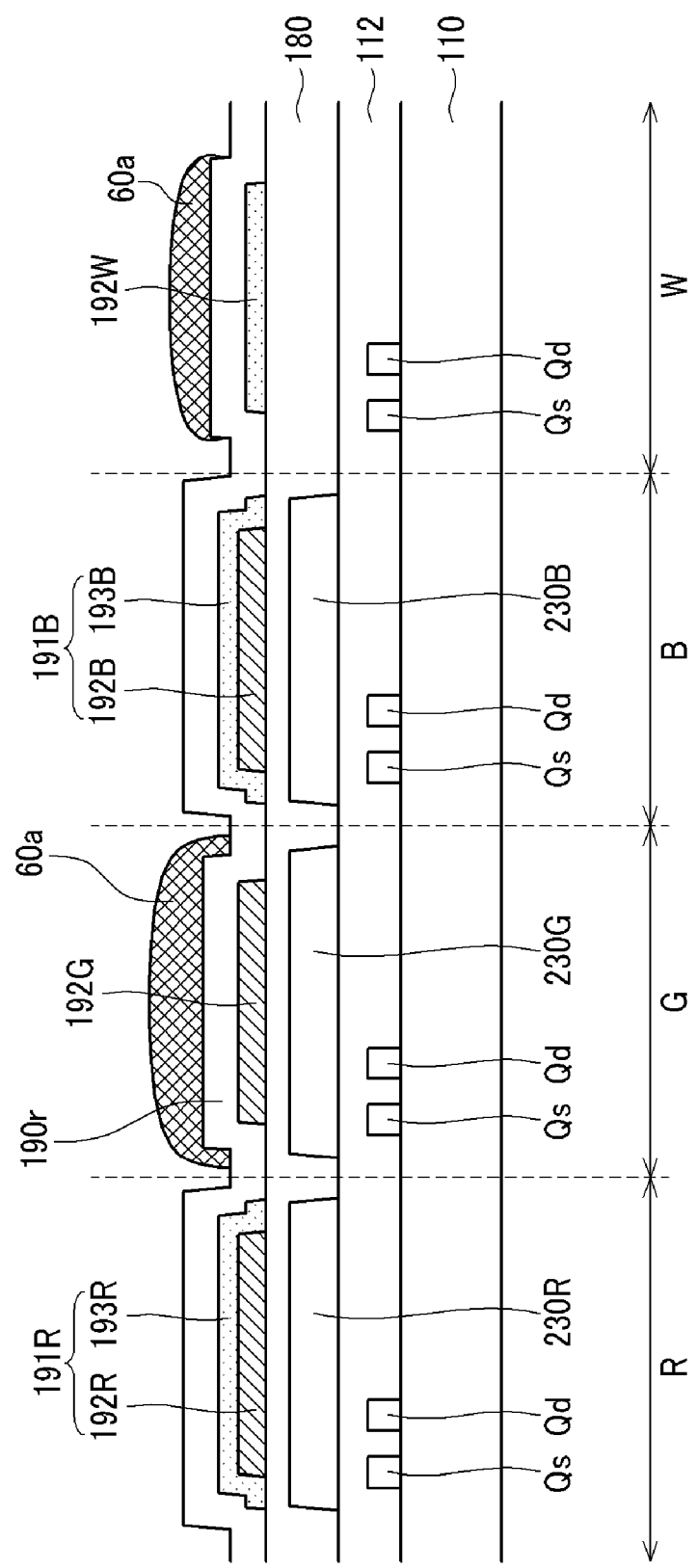

As shown in FIG. 11, an upper conductive layer 190r is formed on the first transparent conductive layers 193R, 193B, and 192W, the translucent conductive layers 192G, and the overcoat layer 180. The upper conductive layer 190r may be formed by depositing ITO at a relatively low temperature of about 20° C. to 150° C., namely, the ITO being in an amorphous state, or may be formed by depositing IZO. The upper conductive layer 190r may be formed to be thicker than the intermediate conductive layer 190q.

Thereafter, a third photosensitive film (not shown) is coated on the upper conductive layer 190r and is patterned to form third photosensitive patterns 60a in the green pixels G and the white pixels W.

Figure 12:
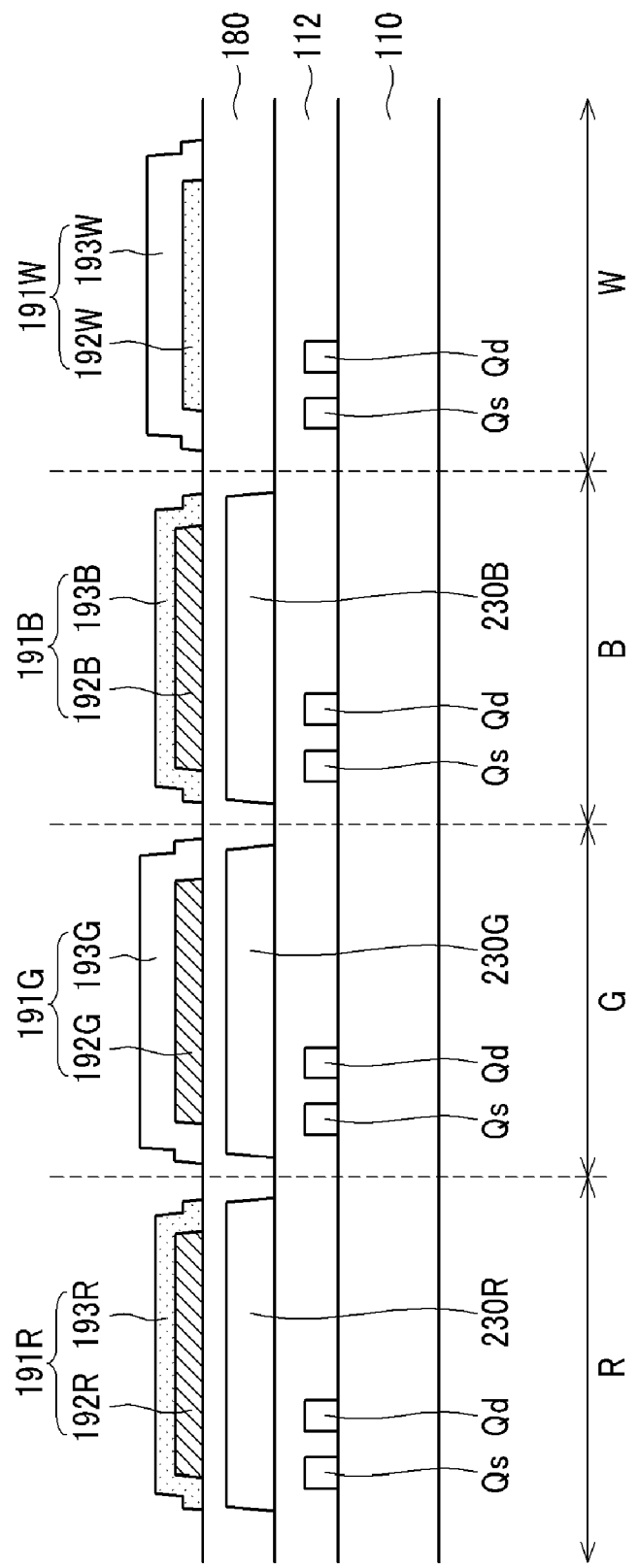

Then, as shown in FIG. 11 and FIG. 12, a photolithography process is performed on the upper conductive layer 190r using the third photosensitive patterns 60a to form the second transparent conductive layers 193G and 193W in the green pixels G and the white pixels W, respectively.

In this case, the upper conductive layer 190r may be made of amorphous ITO or IZO, and the first transparent conducive layers 193R and 193B may be made of crystalline ITO, so their etching ratios are different. Thus, when the upper conductive layer 190r is etched, the first lower first transparent conductive layers 193R and 193B are not affected.

The translucent conductive layers 192G and the second transparent conductive layers 193G form the pixel electrodes 191G in the green pixels G, and the first transparent conductive layers 192W and the second transparent conductive layers 193W form the pixel electrodes 191W in the white pixels W.

Figure 13:
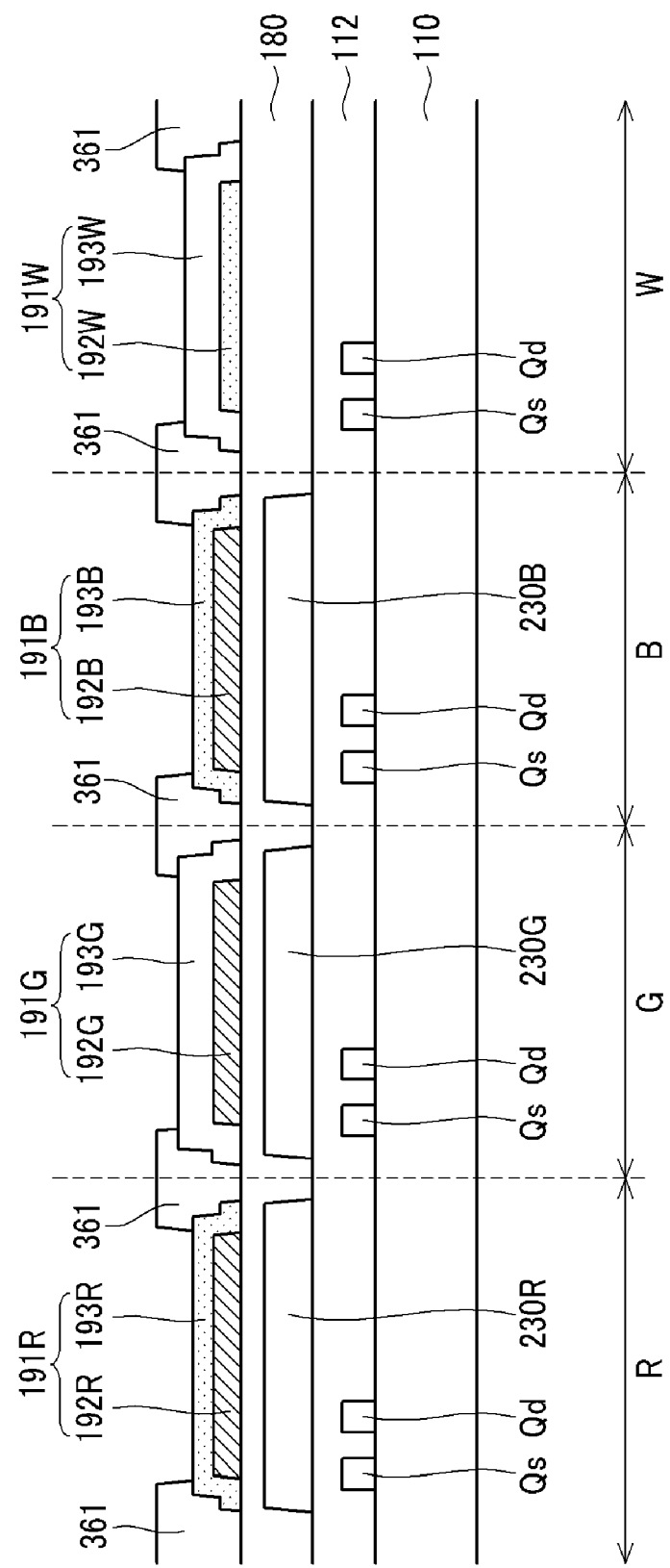

Next, as shown in FIG. 13, an insulating layer is coated on the pixel electrodes 191R, 191G, 191B, and 191W, and the overcoat layer 180, to form a plurality of insulation members 361 positioned between the pixel electrodes 191R, 191G, 191B, and 191W.

Figure 14:
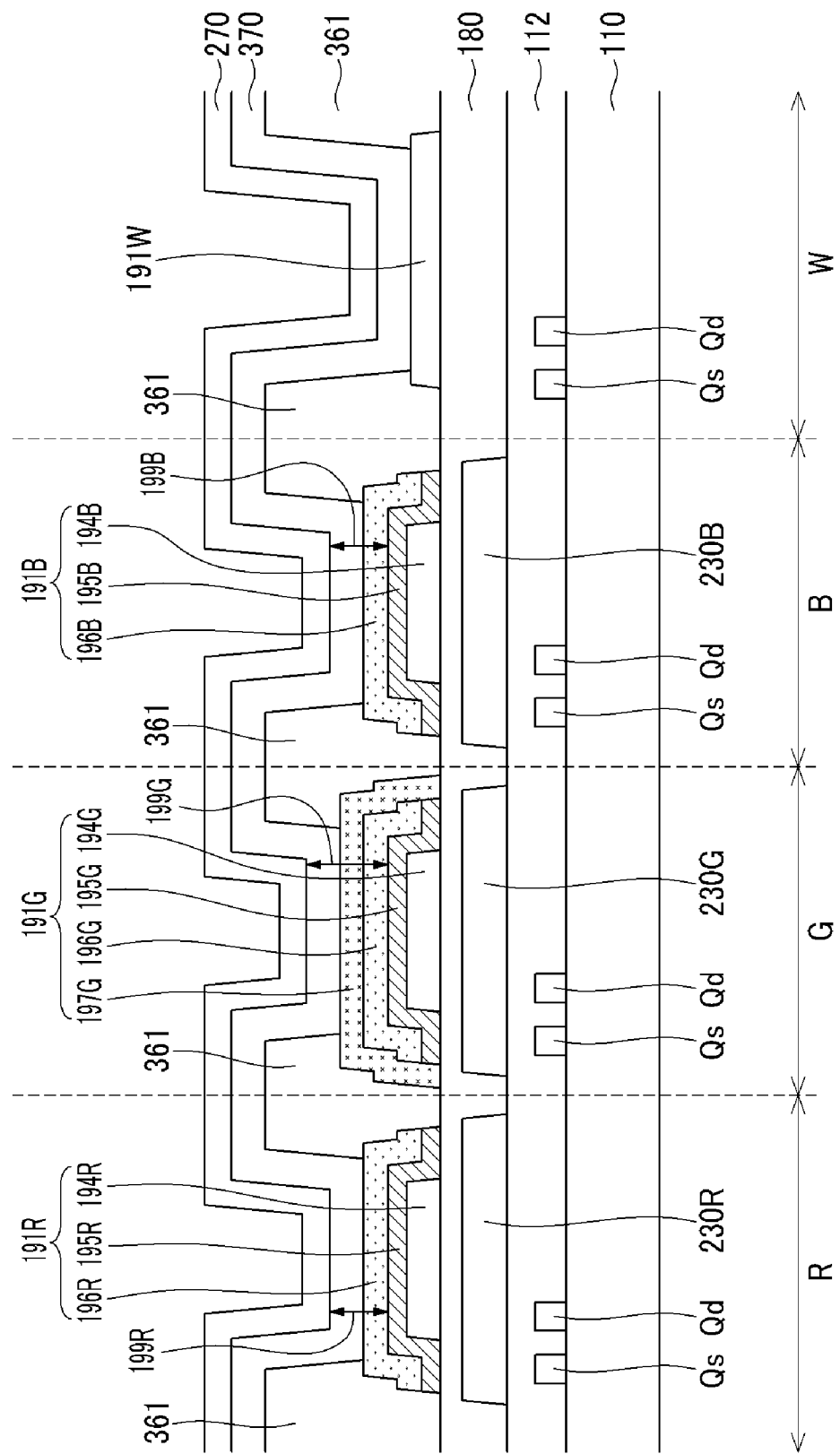
FIG. 14 is a cross-sectional view showing the structure of an OLED according to another exemplary embodiment of the present invention.

Subsequently, as shown in FIG. 14, the emission layer 370 is formed by sequentially forming a red emission layer (not shown), a blue emission layer (not shown), and a green emission layer (not shown) on the entire surface of the substrate 110.

The common electrode 270 is then formed on the emission layer 370.

Accordingly, because the transparent conductive layer acts as a pixel electrode in each pixel, because the first and second transparent conductive layers are formed according to each different process in order for the transparent conductive layer of the green pixel and the transparent conductive layers of the red and blue pixels to each have a different thickness, and because the first transparent conductive layers 193R and 193B and the second transparent conductive layer 193G are made of different materials each having a different etching ratio, the processes may be simplified without any additional process or masks.

Exemplary Embodiment 2

The OLED in FIG. 14, according to another exemplary embodiment of the present invention, will now be described with reference to FIG. 1 and FIG. 2.

FIG. 14 is a cross-sectional view showing the structure of an OLED according to another exemplary embodiment of the present invention.

A TFT array including switching TFTs Qs and driving TFTs Qd is arranged on the insulation substrate 110 in each pixel.

The passivation layer 112 is disposed on the TFT arrays, and red filters 230R, green filters 230G, and blue filters 230B are disposed on the passivation layer 112 at the red pixels R, the green pixels G, and the blue pixels B, respectively. Either no color filters or transparent white filters (not shown) may be formed in the white pixels W. The overcoat layer 180 is disposed on the color filters 230R, 230G, and 230B, and on the passivation layer 112.

The pixel electrodes 191R, 191G, 191B, and 191W are disposed on the overcoat layer 180.

Also, in this exemplary embodiment, the pixel electrodes 191R, 191G, 191B, and 191W of each pixel have a different layered structure. The layered structure according to this exemplary embodiment is different from that of the former exemplary embodiment as described above.

Each pixel electrode 191R of the red pixels R may be a triple-layered structure including a lower first transparent conductive layer 194R, a translucent conductive layer 195R, and an upper first transparent conductive layer 196R.

Each pixel electrode 191B of the blue pixels B may also be a triple-layered structure including a lower first transparent conductive layer 194B, a translucent conductive layer 195B, and an upper first transparent conductive layer 196B.

Each pixel electrode 191G of the green pixels G may be a quadruple-layered structure including a lower first transparent conductive layer 194G, a translucent conductive layer 195G, an upper first transparent conductive layer 196G, and a second transparent conductive layer 197G.

Each pixel electrode 191W of the white pixels W may be a single layered structure as a transparent conductive layer.

The translucent conductive layers 195R, 195B, and 195G disposed in the red pixels R, the blue pixels B, and the green pixels G form microcavity structures 199R, 199B, and 199G together with the common electrode 270.

The lower first transparent conductive layers 194R, 194B, and 194G and the upper first transparent conductive layers 196R, 196B, and 196G disposed in the red pixels R, the blue pixels B, and the green pixels G, respectively, and the pixel electrodes 191W at the white pixels W) may be a conductive oxide such as ITO, IZO, ZnO, etc., and may have a thickness of about 500 Å to 1500 Å.

The second transparent conductive layers 197G disposed in the green pixels G may be a conductive oxide such as ITO, IZO, ZnO, etc., but should be made of a material having a different etching ratio from those of the lower first transparent conductive layers 194R, 194B, and 194G, the upper first transparent conductive layers 196R, 196B, and 196G, and the pixel electrodes 191W in the white pixels W. For example, if the lower first transparent conductive layers 194R, 194B, and 194G, the upper first transparent conductive layers 196R, 196B, and 196G, and the pixel electrodes 191W in the white pixels W are made of crystalline ITO, the second transparent conductive layers 197G may be made of IZO, ZnO, or amorphous ITO. The second transparent conductive layers 197G may have a thickness of about 200 Å to 500 Å.

A plurality of insulation members 361 are disposed on the pixel electrodes 191R, 191B, 191G, and 191W, and an organic light emitting member including the organic emission layer 370 is disposed on the plurality of insulation members 361 and on the pixel electrodes 191R, 191B, 191G, and 191W. The common electrode 270 is disposed on the organic light emitting member.

Like in the former exemplary embodiment, the translucent conductive layers 195R, 195B, and 195G are included in the red pixels R, the blue pixels B, and the green pixels G to form the microcavity structures 199R, 199B, and 199G together with the common electrode 270.

However, unlike the former exemplary embodiment, the green pixels G include the lower first transparent conductive layers 194G and the upper first transparent conductive layers 196G like the red pixels R and the blue pixels B, but additionally include second transparent conductive layers 197G unlike the red pixels R and the blue pixels B, so the length of an optical path may be different.

The method of manufacturing the OLED of FIG. 14 will now be described with reference to FIG. 15, FIG. 16, FIG. 17, FIG. 18, FIG. 19, FIG. 20, and FIG. 21.

FIG. 15, FIG. 16, FIG. 17, FIG. 18, FIG. 19, FIG. 20, and FIG. to 21 are cross-sectional views showing the method of manufacturing an OLED in FIG. 14 according to another exemplary embodiment of the present invention.

Figure 15:
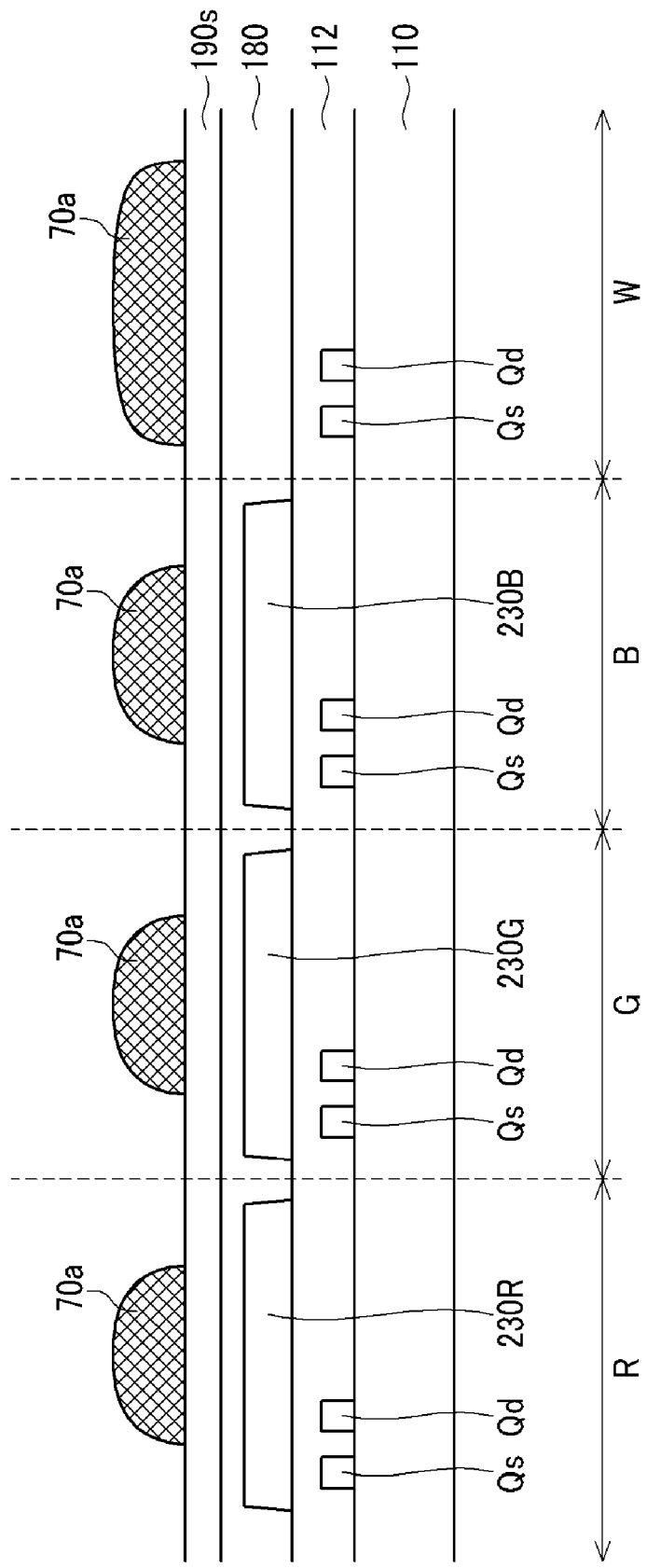
FIG. 15, FIG. 16, FIG. 17, FIG. 18, FIG. 19, FIG. 20, and FIG. 21 are sequential cross-sectional views showing the method of manufacturing the organic light emitting device in FIG. 14 according to another exemplary embodiment of the present invention.

As shown in FIG. 15, as in the former exemplary embodiment as described above, a plurality of switching TFTs Qs and a plurality of TFTs Qd are formed on the insulation substrate 110, and the passivation layer 112, the plurality of color filters 230R, 230G, and 230B, and the overcoat layer 180 are sequentially formed thereon.

Next, a lower conductive layer 190s is formed on the overcoat layer 180. The lower conductive layer 190s is formed by depositing ITO at about 200° C. to 400° C. The lower conductive layer 190s may have a thickness of about 500 Å to 1500 Å.

Then, a first photosensitive film (not shown) is coated on the lower conductive layer 190s and is patterned to form first photosensitive patterns 70a in the red pixels R, the green pixels G, the blue pixels B, and the white pixels W.

Figure 16:
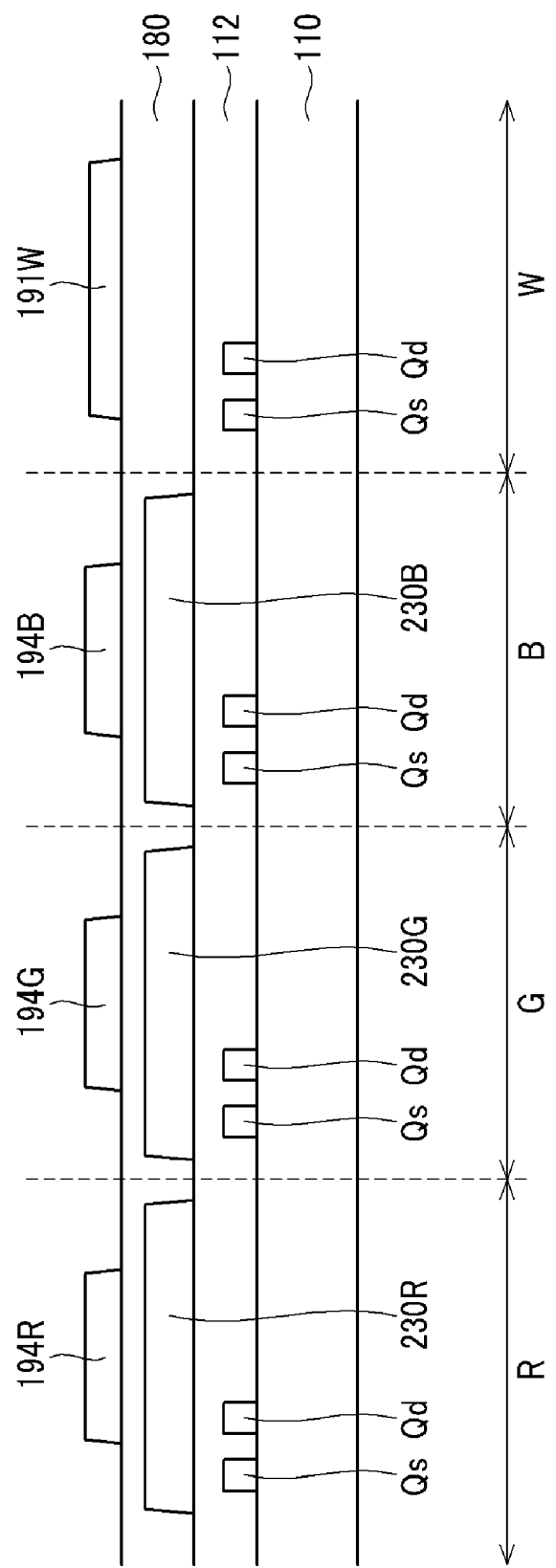

Thereafter, as shown in FIG. 15 and FIG. 16, photolithography is performed on the lower conductive layer 190s using the first photosensitive patterns 70a to form lower first transparent conductive layers 194R, 194G, and 194B in the red pixels R, the green pixels G, and the blue pixels B, respectively, and pixel electrodes 191W in the white pixels W.

Figure 17:
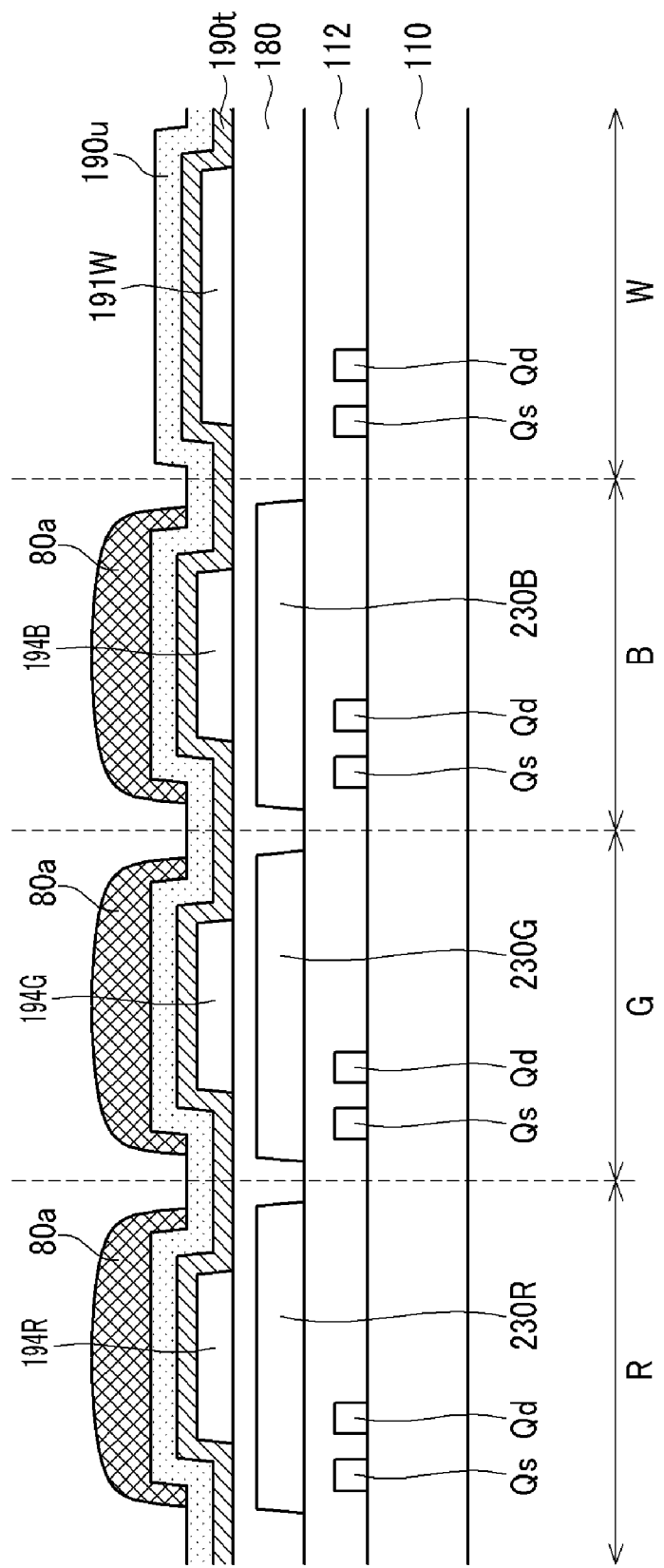

Subsequently, as shown in FIG. 17, an intermediate conductive layer 190t and an upper conductive layer 190u are sequentially formed on the lower first transparent conductive layers 194R, 194G, and 194B, on the pixel electrodes 191W, and on the overcoat layer 180. The intermediate conductive layer 190t may be made of silver (Ag), aluminum (Al), gold (Au), nickel (Ni), magnesium (Mg), their alloys, etc., and may have a thickness of about 100 Å to 400 Å, and the upper conductive layer 190u may be formed by depositing ITO at about 200° C. to 400° C.

Then, a second photosensitive film (not shown) is coated on the upper conductive layer 190u and is patterned to form second photosensitive patterns 80a at the red pixels R, the blue pixels B, and the green pixels G.

Figure 18:
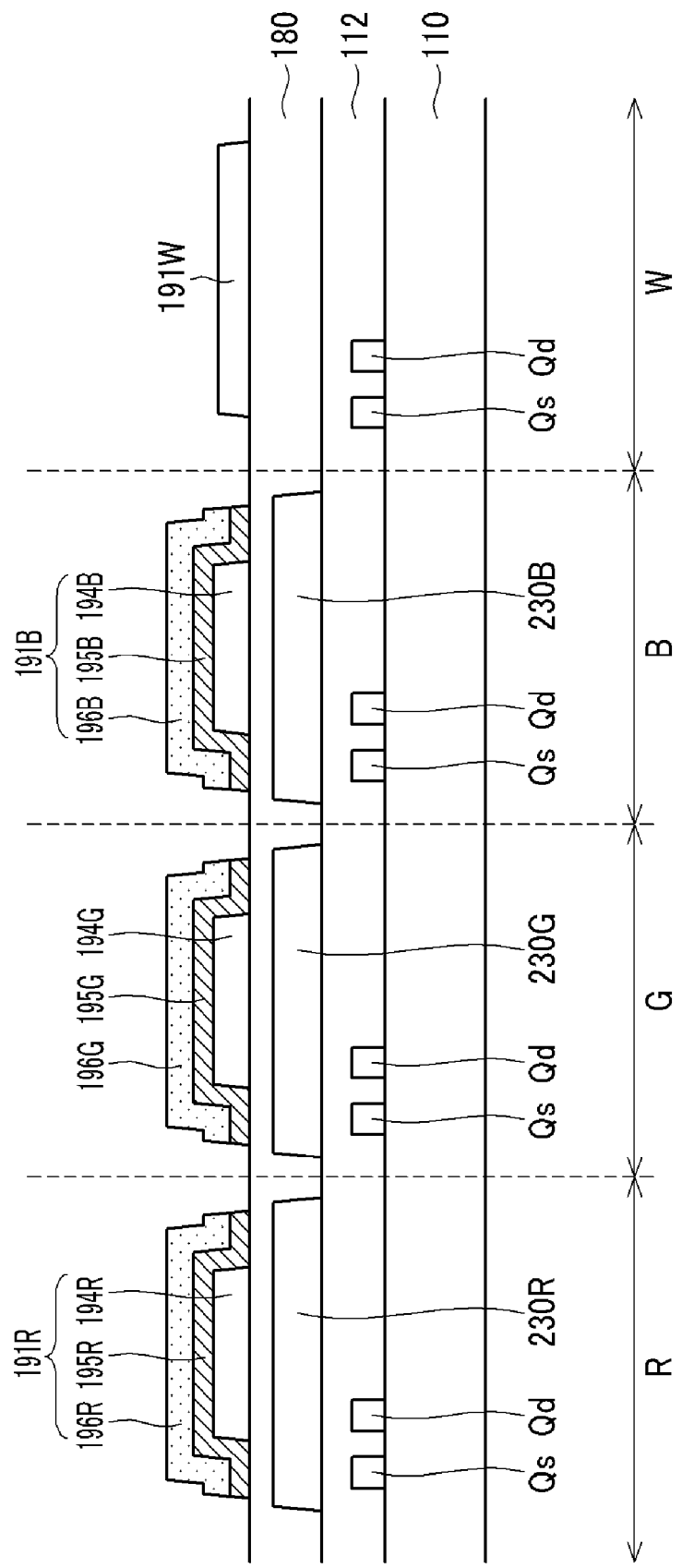

As shown in FIG. 17 and FIG. 18, a photolithography process is sequentially performed on the upper conductive layer 190u and the intermediate conductive layer 190t using the second photosensitive patterns 80a to form translucent conductive layers 195R, 195B, and 195G, and upper first transparent conductive layers 196R, 196B, and 196G in the red pixels R, the blue pixels B, and the green pixels G, respectively.

The lower first transparent conductive layers 194R, the translucent conductive layers 195R, and the upper first transparent conductive layers 196R form the pixel electrodes 191R of the red pixels R, and the lower first transparent conductive layers 194B, the translucent conductive layers 195B, and the upper first transparent conductive layers 196B form the pixel electrodes 191B of the blue pixels B.

Figure 19:
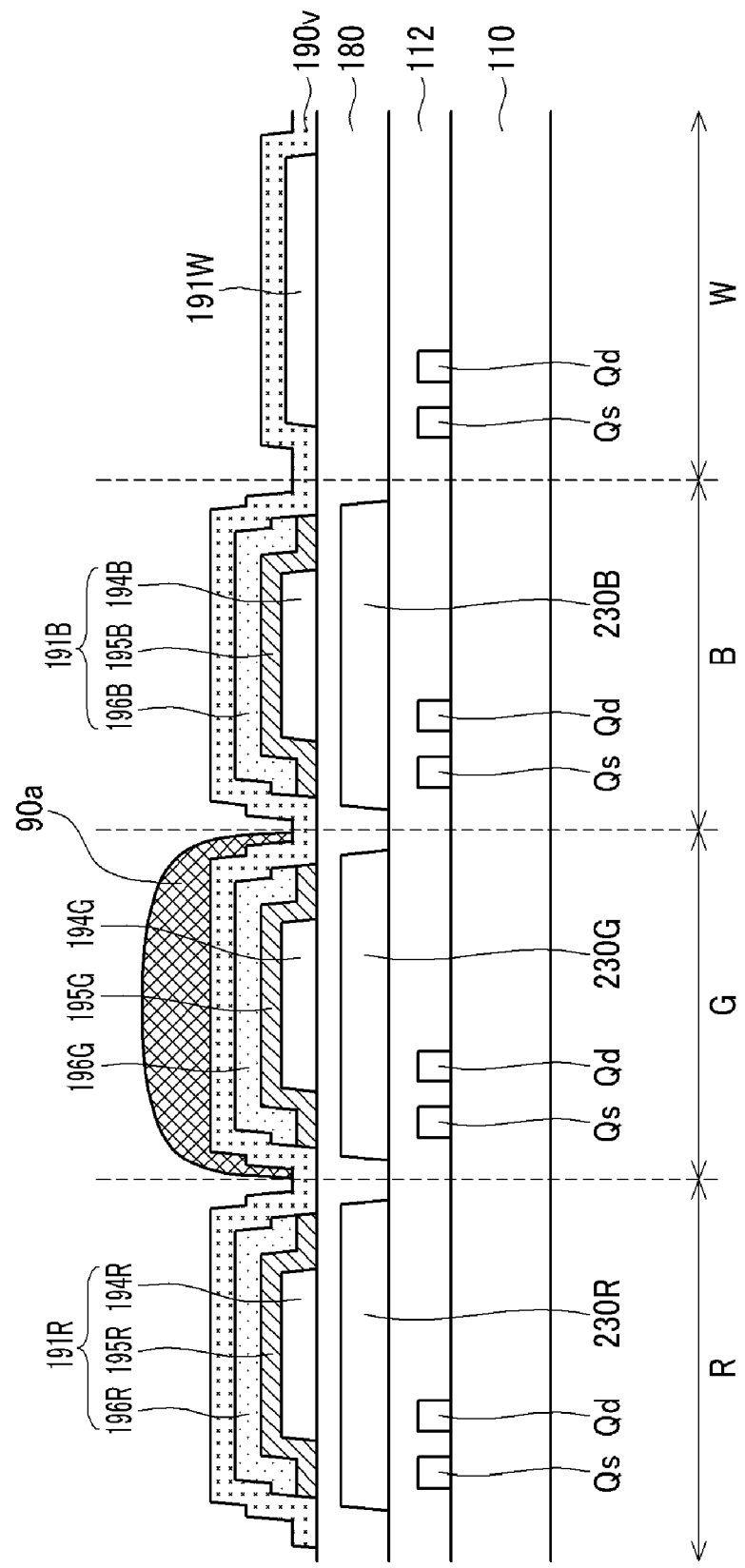

As shown in FIG. 19, an uppermost conductive layer 190v is formed on the upper first transparent conductive layers 196R, 196B, and 196G, the pixel electrodes 191W in the white pixels W, and the overcoat layer 180. The uppermost conductive layer 190v may be formed by depositing ITO at a relatively low temperature of about 20° C. to 150° C., namely, ITO being in an amorphous state, or by depositing IZO.

Then, a third photosensitive film (not shown) is coated on the uppermost conductive layer 190v and is patterned to form a third photosensitive patterns 90a in the green pixels G.

Figure 20:
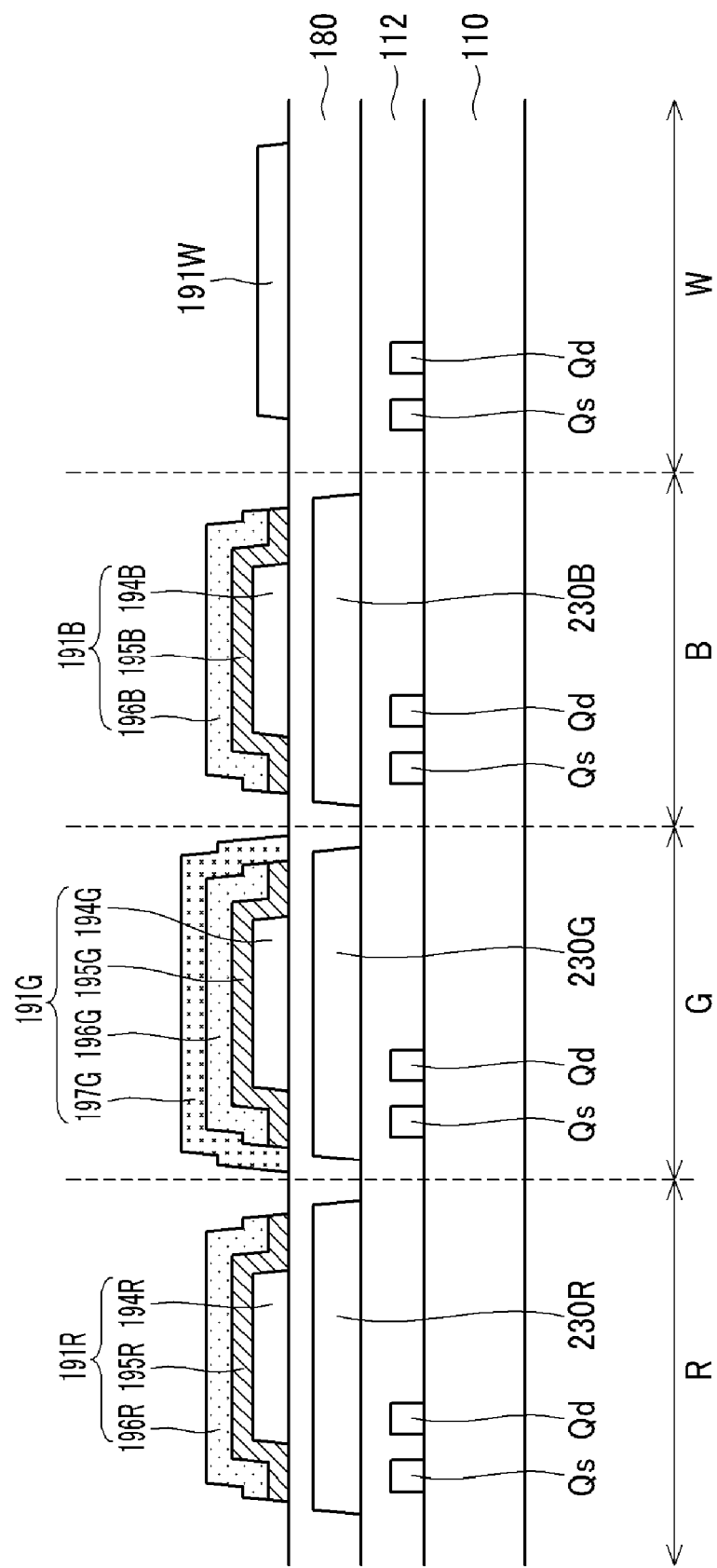

Thereafter, as shown in FIG. 19 and FIG. 20, a photolithography process is performed on the uppermost conductive layer 190v using the third photosensitive patterns 90a to form the second transparent conductive layers 197G in the green pixels G.

The lower first transparent conductive layers 194G, the translucent conductive layers 195G, the upper first transparent conductive layers 196G, and the second transparent conductive layers 197G form the pixel electrodes 191G of the green pixels G.

Figure 21:
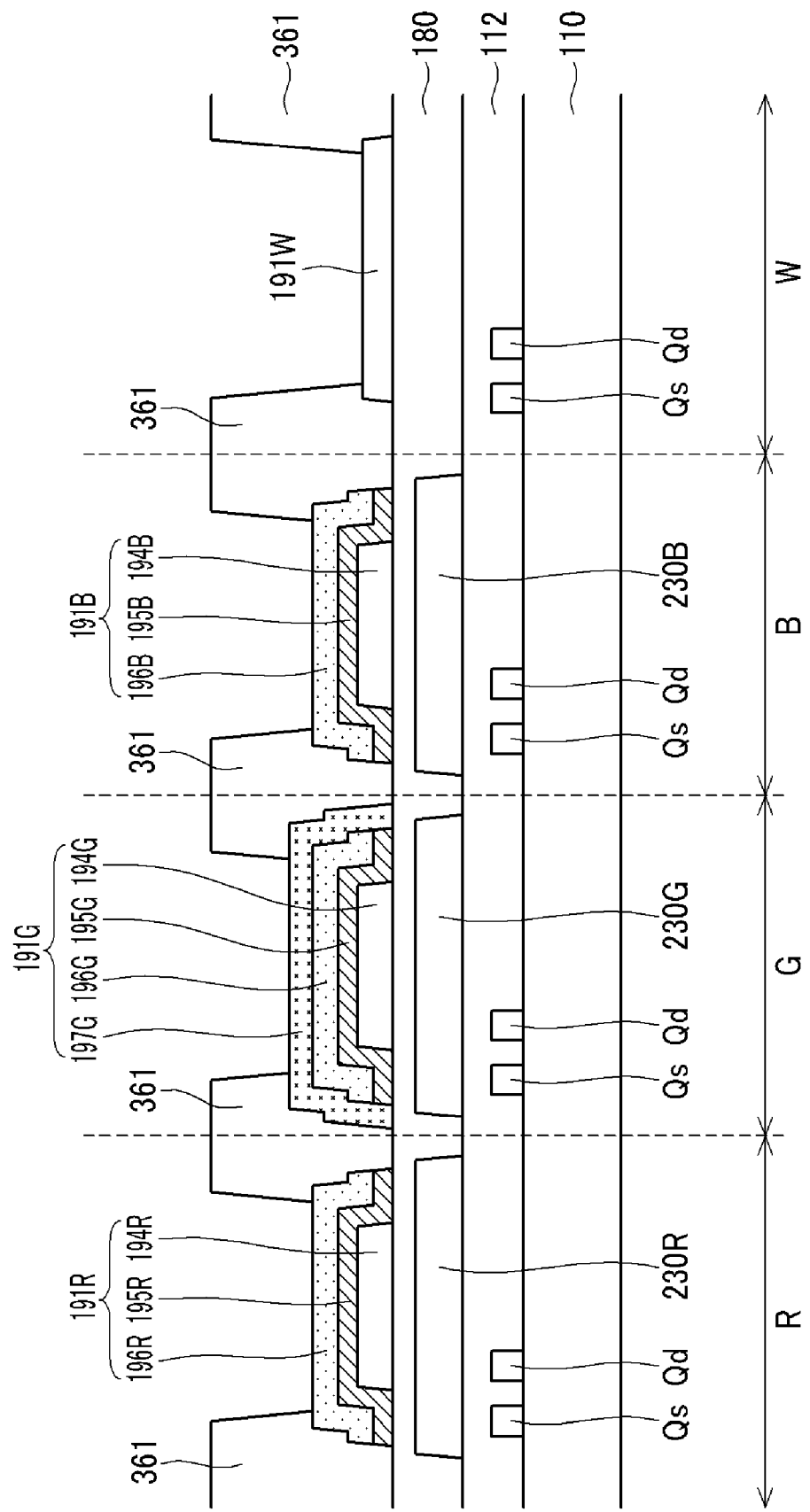

As shown in FIG. 21, an insulating layer is then coated on the pixel electrodes 191R, 191G, 191B, and 191W and the overcoat layer 180, and is patterned to form a plurality of insulation members 361 positioned between the pixel electrodes 191R, 191G, 191B, and 191W.

Thereafter, the emission layer 370 is formed by sequentially forming a red emission layer (not shown), a blue emission layer (not shown), and a green emission layer (not shown) on the entire surface of the substrate 110.

Subsequently, the common electrode 270 is formed on the emission layer 370.

Exemplary Embodiment 3

A further exemplary embodiment of the present invention will be described in detail with reference to FIG. 22 as well as FIG. 1 and FIG. 2.

Figure 22:
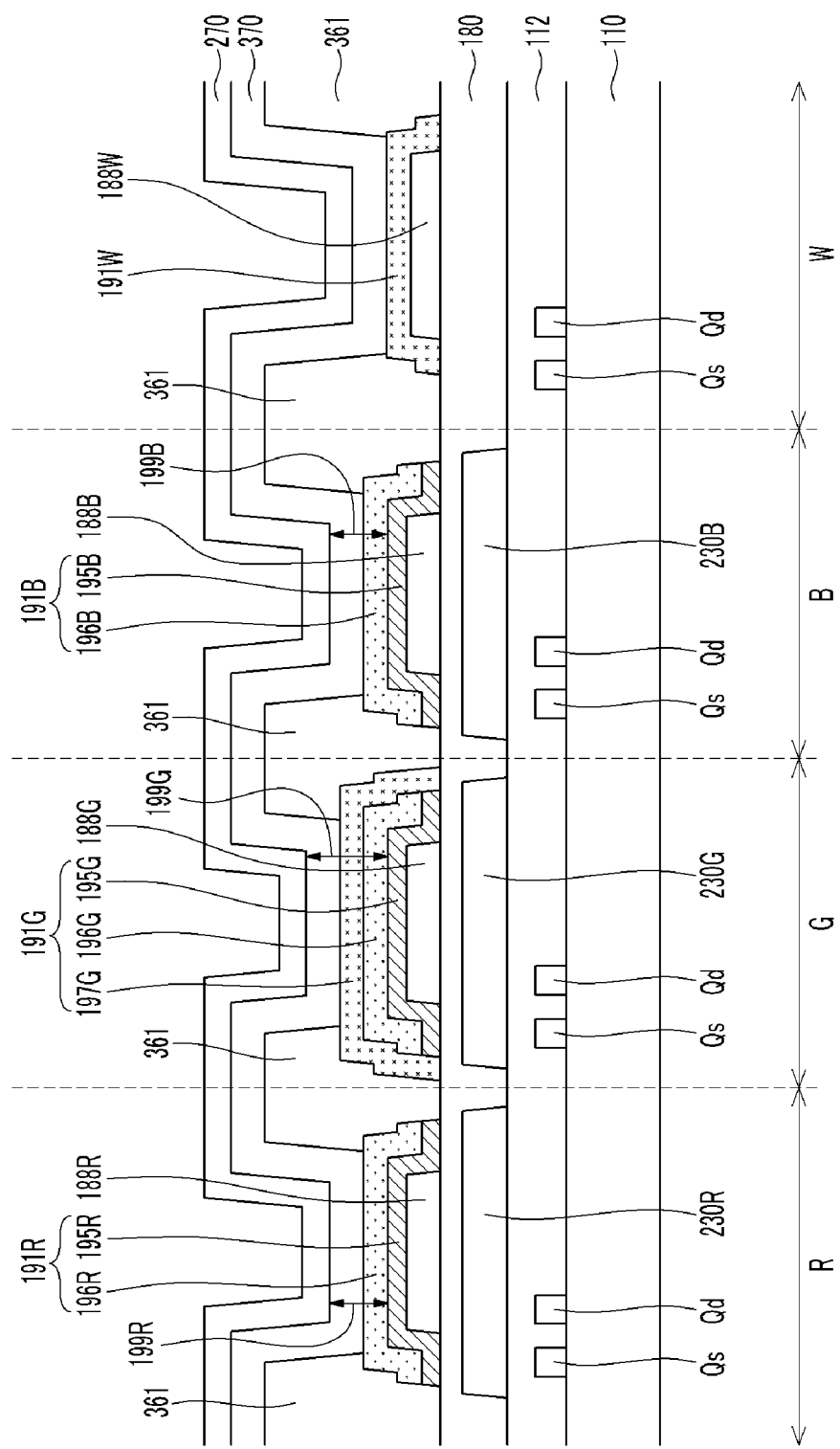
FIG. 22 is a cross-sectional view showing the structure of an OLED according to another exemplary embodiment of the present invention.

FIG. 22 is a cross-sectional view showing the structure of an OLED according to another exemplary embodiment of the present invention.

Unlike the above-described exemplary embodiments, in this exemplary embodiment, an auxiliary layer is provided in each pixel to adjust the length of the microcavity.

A TFT array including a switching TFT Qs and a driving TFT Qd is arranged on the insulation substrate 110 in each pixel.

The passivation layer 112 is disposed on the TFT arrays, and the red filters 230R, the green filters 230G, and the blue filters 230B are disposed on the passivation layer 112 in the red pixels R, the green pixels G, and the blue pixels B, respectively. Either no color filters or transparent white filters (not shown) may be disposed in the white pixels W. The overcoat layer 180 is disposed on the color filters 230R, 230G, and 230B, and on the passivation layer 112.

The auxiliary layers 188R, 188G, 188B, and 188W are disposed on the overcoat layer 180. The auxiliary layers 188R, 188G, 188B, and 188W may be made of silicon nitride ($SiN_x$), silicon oxide ($SiO_2$), or SiON, and may contain the same material as that of the passivation layer 180. The auxiliary layers 188R, 188G, 188B, and 188W may have a thickness of about 400 Å to 1000 Å, which is related to the thickness of the pixel electrodes 191W in the white pixels W.

The pixel electrodes 191R, 191G, 191B, and 191W are disposed on the auxiliary layers 188R, 188G, 188B, and 188W.

A layered structure of the pixel electrodes 191R and 191B is different from that of each of the pixel electrode 191G and the pixel electrode 191W, and a layered structure of the pixel electrode 191G is different from that of the pixel electrode 191W.

Each pixel electrode 191R of the red pixels R may be a dual-layered structure including the translucent conductive layer 195R and the first transparent conductive layer 196R, and each pixel electrode 191B of the blue pixels B may also be a dual-layered structure including the translucent conductive layer 195B and the first transparent conductive layer 196B.

Each pixel electrode 191G of the green pixels G may be a triple-layered structure including the translucent conductive layer 195G, the first transparent conductive layer 196G, and the second transparent conductive layer 197G.

Each pixel electrode 191W of the white pixels W may be a single layered structure that may be made of the same material as the second transparent conductive layer 197G.

The translucent conductive layers 195R, 195B, and 195G disposed in the red pixels R, the blue pixels B, and the green pixels G may be made of a material having properties that allow portions of light to be transmitted therethrough while other portions of light are reflected thereon, such as silver (Ag), aluminum (Al), gold (Au), nickel (Ni), magnesium (Mg), their alloys, etc., with a thickness of about 100 Å to 400 Å.

The first transparent conductive layers 196R, 196B, and 196G, the second transparent conductive layer 197G, and the pixel electrodes 191W of the white pixels W may be made of a transparent conductive oxide such as ITO, IZO, ZnO, etc. In this case, the second transparent conductive layers 197G and the pixel electrodes 191W of the white pixel W may be made of a material having different etching properties from those of the first transparent conductive layers 196R, 196B, and 196G. For example, if the first transparent conductive layers 196R, 196B, and 196G are made of crystalline ITO, the second transparent conductive layers 197G and the pixel electrodes 191W of the white pixels W may be made of IZO or ZnO, or amorphous ITO. This is to prevent the first transparent conductive layers 196R, 196B, and 196G from being etched together in the process of forming the second transparent conductive layers 197G and the pixel electrodes 191W of the white pixel W.

The first transparent conductive layers 196R, 196B, and 196G may have a thickness of about 100 Å to 1000 Å, and more specifically of about 100 Å to 500 Å. The second transparent conductive layers 197G and the pixel electrodes 191W of the white pixels W may also have a thickness of about 100 Å to 1000 Å, and more specifically of about 100 Å to 500 Å.

A plurality of insulation members 361 are disposed on the pixel electrodes 191R, 191B, 191G, and 191W, and an organic light emitting member is disposed on the plurality of insulation members 361 and on the pixel electrodes 191R, 191B, 191G, and 191W.

The common electrode 270 is disposed on the organic light emitting member.

In this exemplary embodiment, because the white pixel W does not have a microcavity structure, light emitted from the emission layer passes through the pixel electrode 191W and comes out of the substrate 110 unaltered. Because the pixel electrode 191W of the white pixel W does not have a translucent conductive layer, the pixel electrode 191 W is thinner than the pixel electrodes 191R, 191G, and 191B of the red pixel R, the green pixel G, and the blue pixel B, which have the microcavity structures 199R, 199G, and 199B. With the thickness of about 500 Å to 2000 Å, the pixel electrodes can exhibit optimum optical characteristics, and in the exemplary embodiment of the present invention, the auxiliary layer 188W is provided under the pixel electrode 191W at the white pixel W to complement the optical characteristics of the pixel electrode 191W of the white pixel W.

As described above, the pixel electrodes 191R, 191G, and 191B of the red pixels R, the green pixels G, and the blue pixels B, but not the white pixels W, include the translucent conductive layers 195R, 195G, and 195B, the first transparent conductive layers 196R, 196G, and 196B, and the second transparent conductive layer 197G so the necessary thickness may be satisfied and the optical length for the microcavity may be adjusted.

Meanwhile, auxiliary layers 188W may also be provided in the red pixels R, the green pixels G, and the blue pixels B in the same manner, as well in the white pixels W. In this case, the auxiliary layers may be formed simultaneously with the contact holes in the passivation layer 112, without the necessity of performing any additional photolithography process.

A method of manufacturing the OLED in FIG. 22 will now be described with reference to FIG. 23, FIG. 24, FIG. 25, FIG. 26, FIG. 27, and FIG. 28.

FIG. 23, FIG. 24, FIG. 25, FIG. 26, FIG. 27, and FIG. to 28 are sequential cross-sectional views showing the method of manufacturing the OLED in FIG. 22 according to another exemplary embodiment of the present invention.

Figure 23:
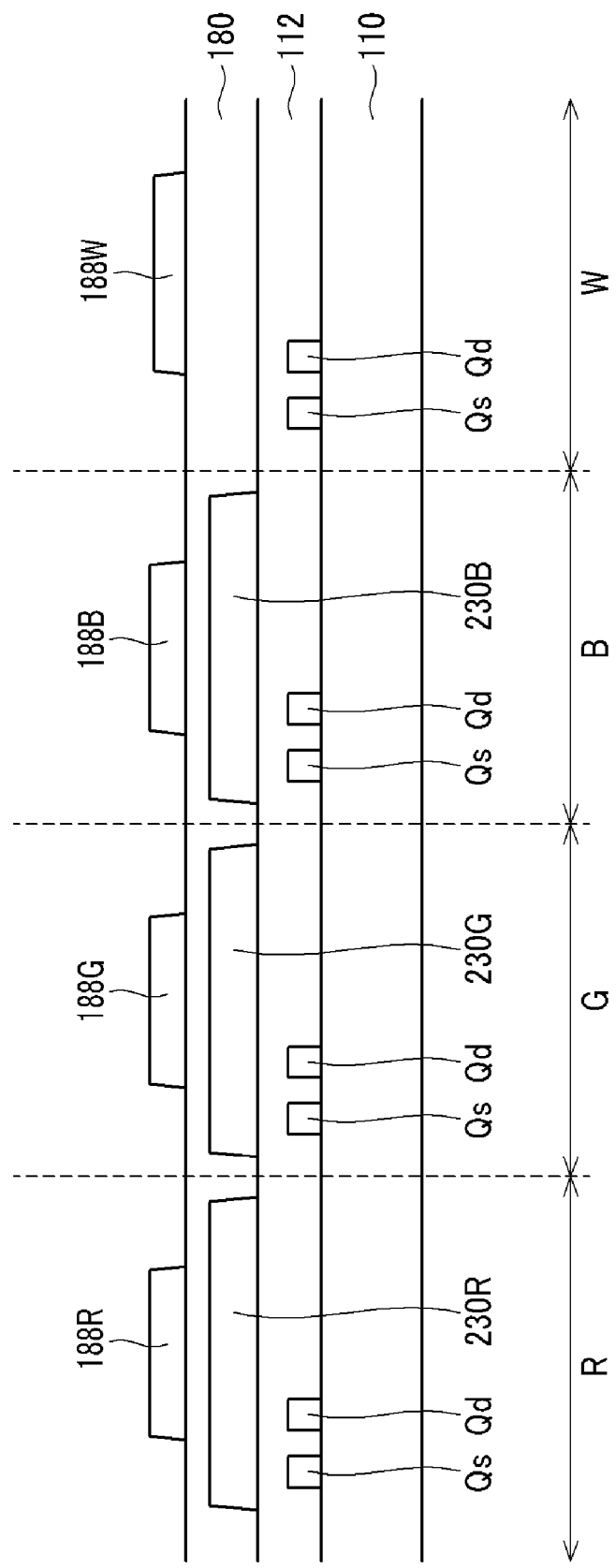
FIG. 23, FIG. 24, FIG. 25, FIG. 26, FIG. 27, and FIG. 28 are sequential cross-sectional views showing the method of manufacturing the OLED in FIG. 22 according to another exemplary embodiment of the present invention.

With reference to FIG. 23, a plurality of switching TFTs Qs and a plurality of driving TFTs Qd are disposed on the insulation substrate 110. Here, the forming of the switching TFTs Qs and the driving TFTs Qd includes forming and patterning a conductive layer, an insulating layer, and a semiconductor layer.

Next, the passivation layer 112 is formed on the entire surface of the substrate 110 including the switching TFTs Qs and the driving TFTs Qd.

Then, the color filters 230R, 230G, and 230B are formed on the passivation layer 112 in the red pixels R, the green pixels G, and the blue pixels B, and the overcoat layer 180 is then formed on the entire surface of the substrate 110 including the color filters 230R, 230G, and 230B.

Subsequently, contact holes (not shown) are formed at positions of the overcoat layer 180 that overlap portions of the driving TFTs Qd, to expose portions of the passivation layer 112.

Thereafter, an inorganic insulating layer (not shown), which may be made of the same material as the passivation layer 112, is formed on the overcoat layer 180.

Subsequently, the inorganic insulating layer is patterned to form the auxiliary layers 188R, 188G, 188B, and 188W positioned in the respective pixels. At this time, the portions of the passivation layer 112 exposed through the contact holes of the overcoat layer 180 are also patterned to expose the lower driving TFTs Qd.

Thus, in the exemplary embodiment of the present invention, because the auxiliary layers 188R, 188G, 188B, and 188W and the passivation layer 180 are formed through a single photolithography process, although the auxiliary layers 188R, 188G, 188B, and 188W are further included, no additional photolithography process is performed.

Figure 24:
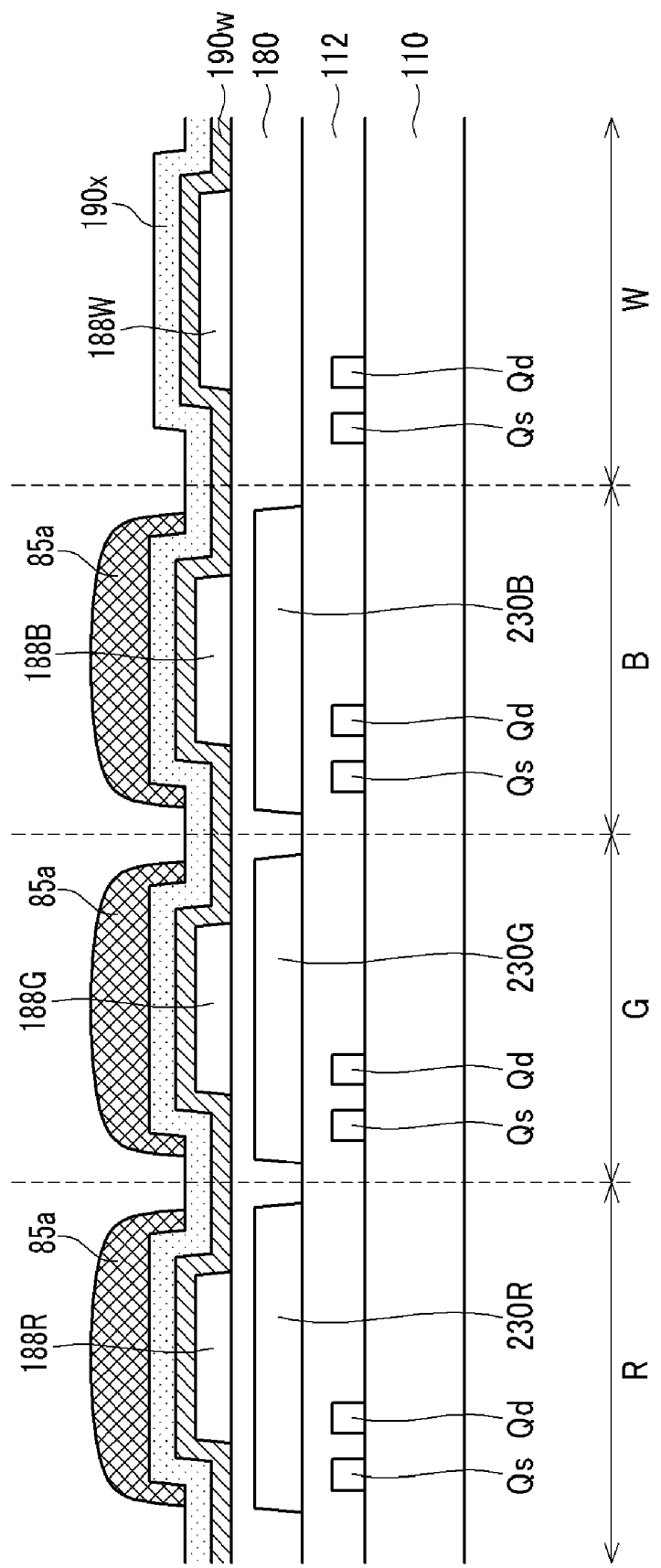

Then, as shown in FIG. 24, a lower conductive layer 190w and an intermediate conductive layer 190x are sequentially formed on the auxiliary layers 188R, 188G, 188B, and 188W and on the overcoat layer 180. The lower conductive layer 190w may be made of silver (Ag), aluminum (Al), gold (Au), nickel (Ni), magnesium (Mg), their alloys, etc., with a thickness of about 100 Å to 400 Å, and the intermediate conductive layer 190x may be formed by depositing ITO at about 200° C. to 400° C.

Then, a first photosensitive film (not shown) is coated on the intermediate conductive layer 190x and then is patterned to form first photosensitive patterns 85a at the red pixels R, the blue pixels B, and the green pixels G.

Figure 25:
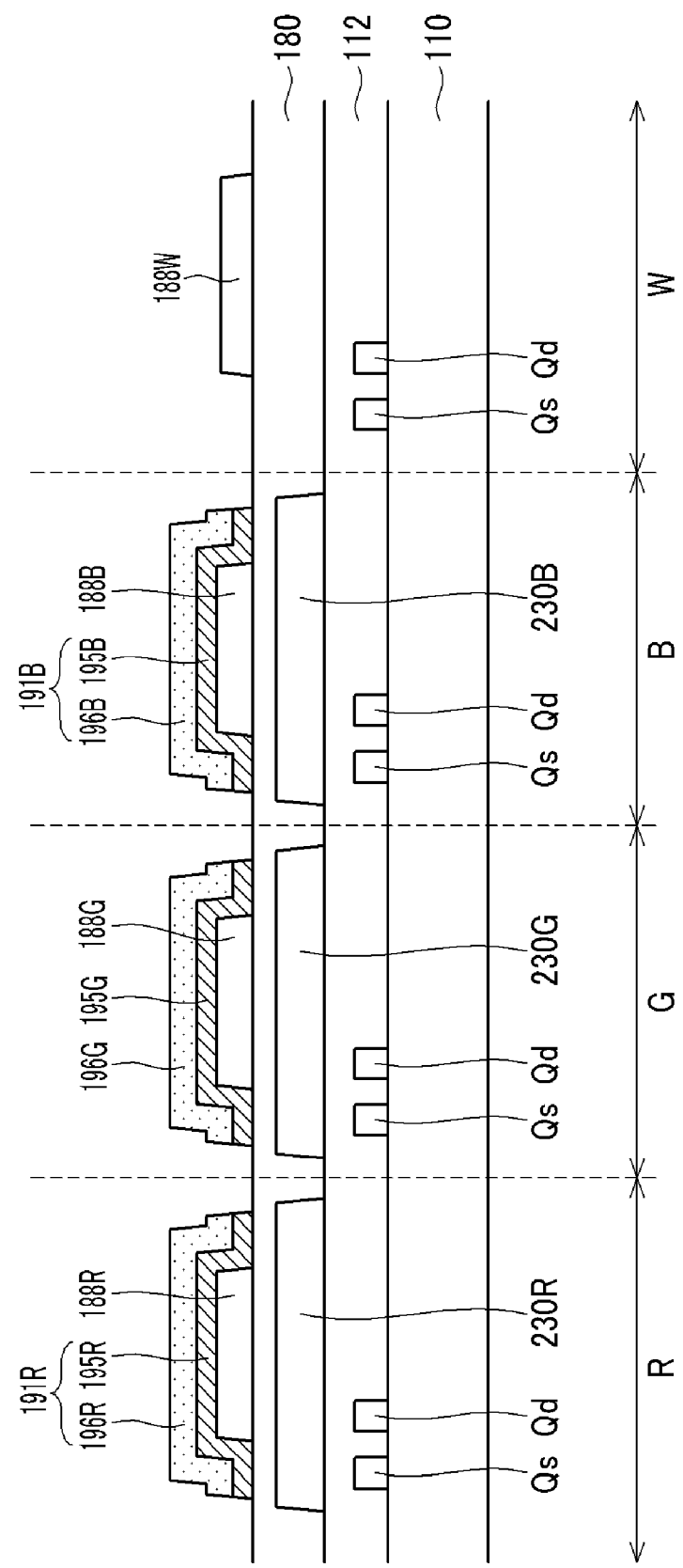

Thereafter, as shown in FIG. 25, the intermediate conductive layer 190x and the lower conductive layer 190w are sequentially etched by using the first photosensitive patterns 85a to form the translucent conductive layers 195R, 195B, and 195G, and the first transparent conductive layers 196R, 196B, and 196G, at the red pixels R, the green pixels G, and the blue pixels B, respectively.

The translucent conductive layers 195R and the first transparent conductive layers 196R of the red pixels R form the pixel electrodes 191R of the red pixels R, and the translucent conductive layers 195B and the first transparent conductive layers 196B of the blue pixels B form the pixel electrodes 191B of the blue pixels B.

Figure 26:
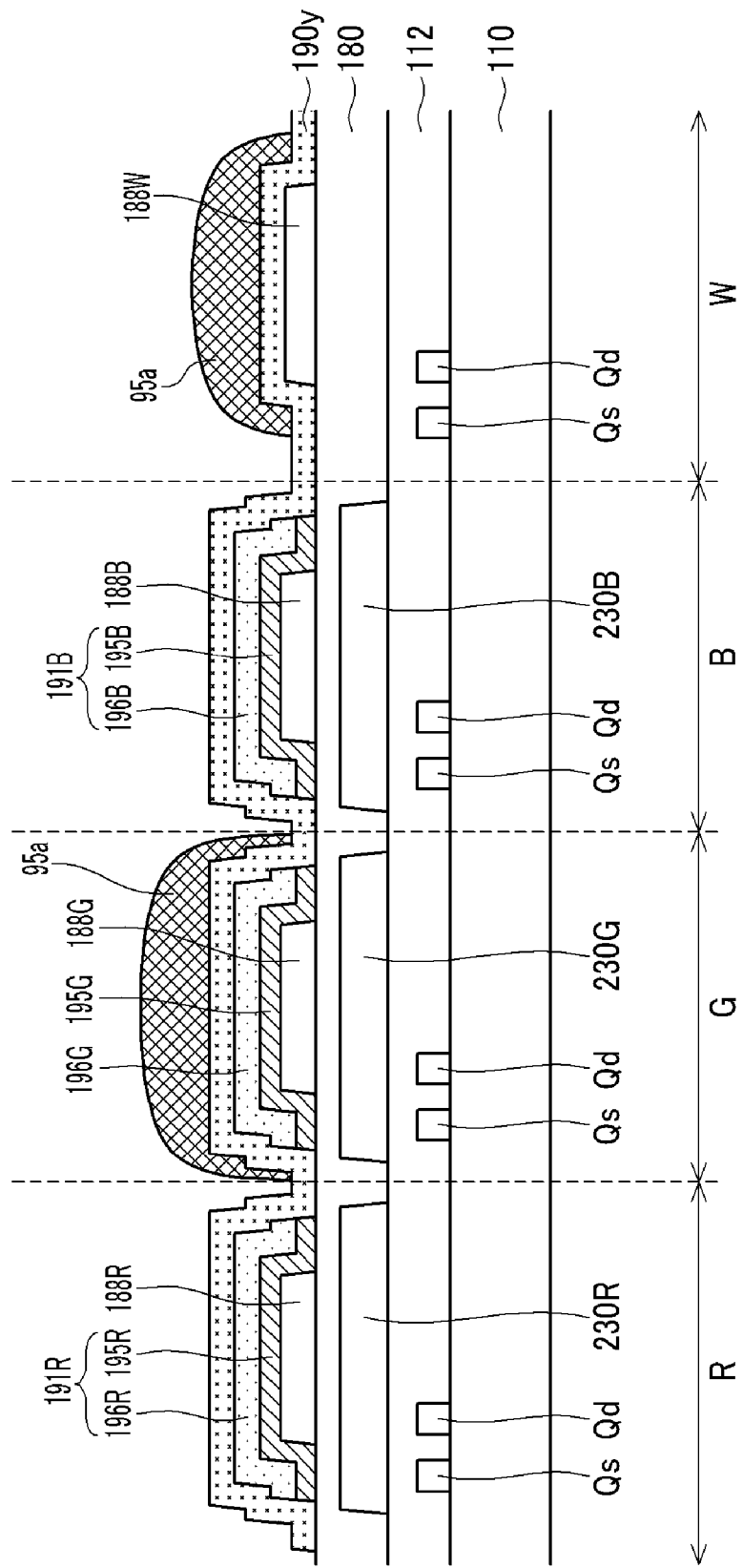

With reference to FIG. 26, an upper conductive layer 190y is disposed on the entire surface of the substrate. The upper conductive layer 190y may be formed of IZO or amorphous ITO deposited at a relatively low temperature of about 20° C. to 150° C., for example, at room temperature.

Subsequently, a second photosensitive film (not shown) is coated on the upper conductive layer 190y and then patterned to form second photosensitive patterns 95a in the green pixels G and the white pixels W.

Figure 27:
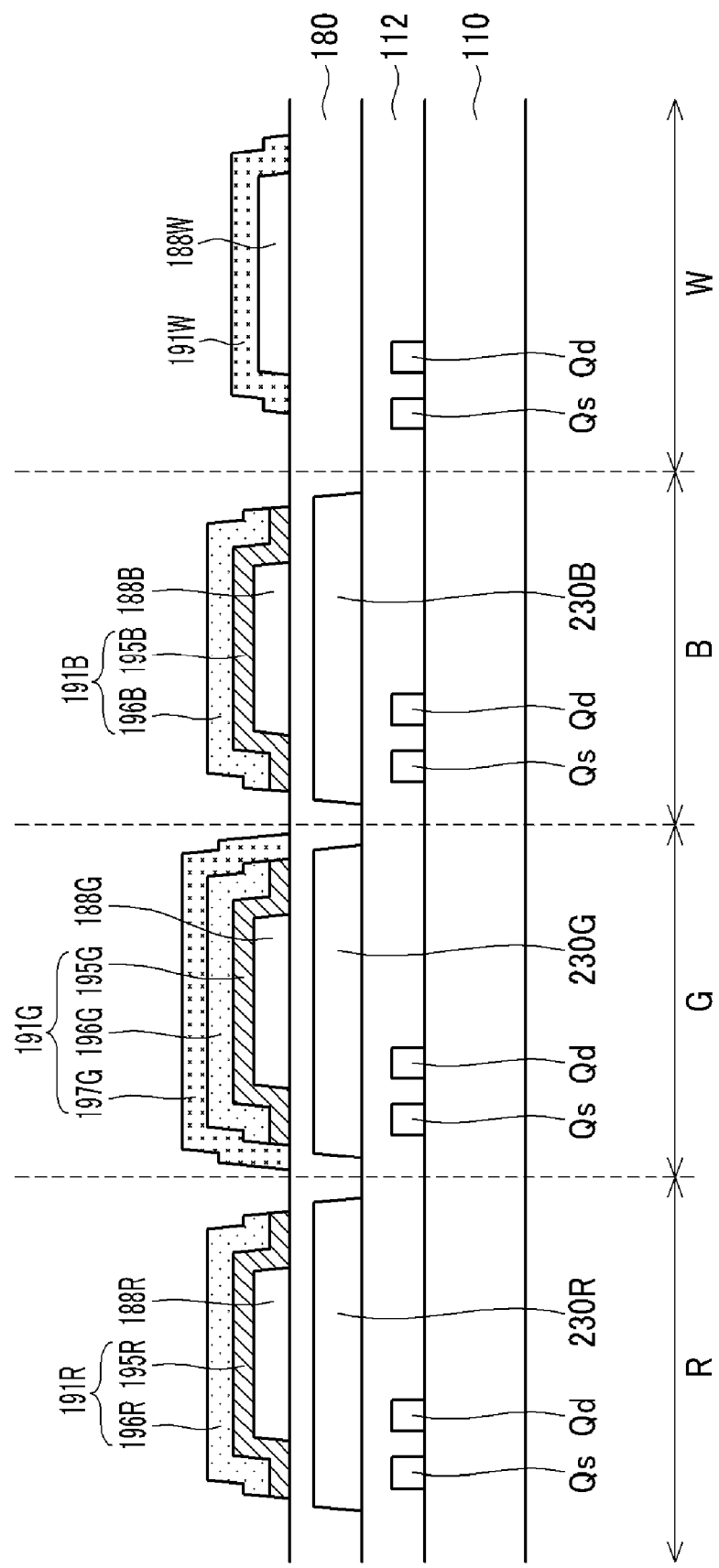

Then, as shown in FIG. 27, the upper conductive layer 190y is etched using the second photosensitive patterns 95a to form the second transparent conductive layers 197G in the green pixels G and the pixel electrodes 191W in the white pixels W.

The translucent conductive layers 195G, the first transparent conductive layers 196G, and the second transparent conductive layers 197G of the green pixels G form the pixel electrodes 191G of the green pixels G.

Figure 28:
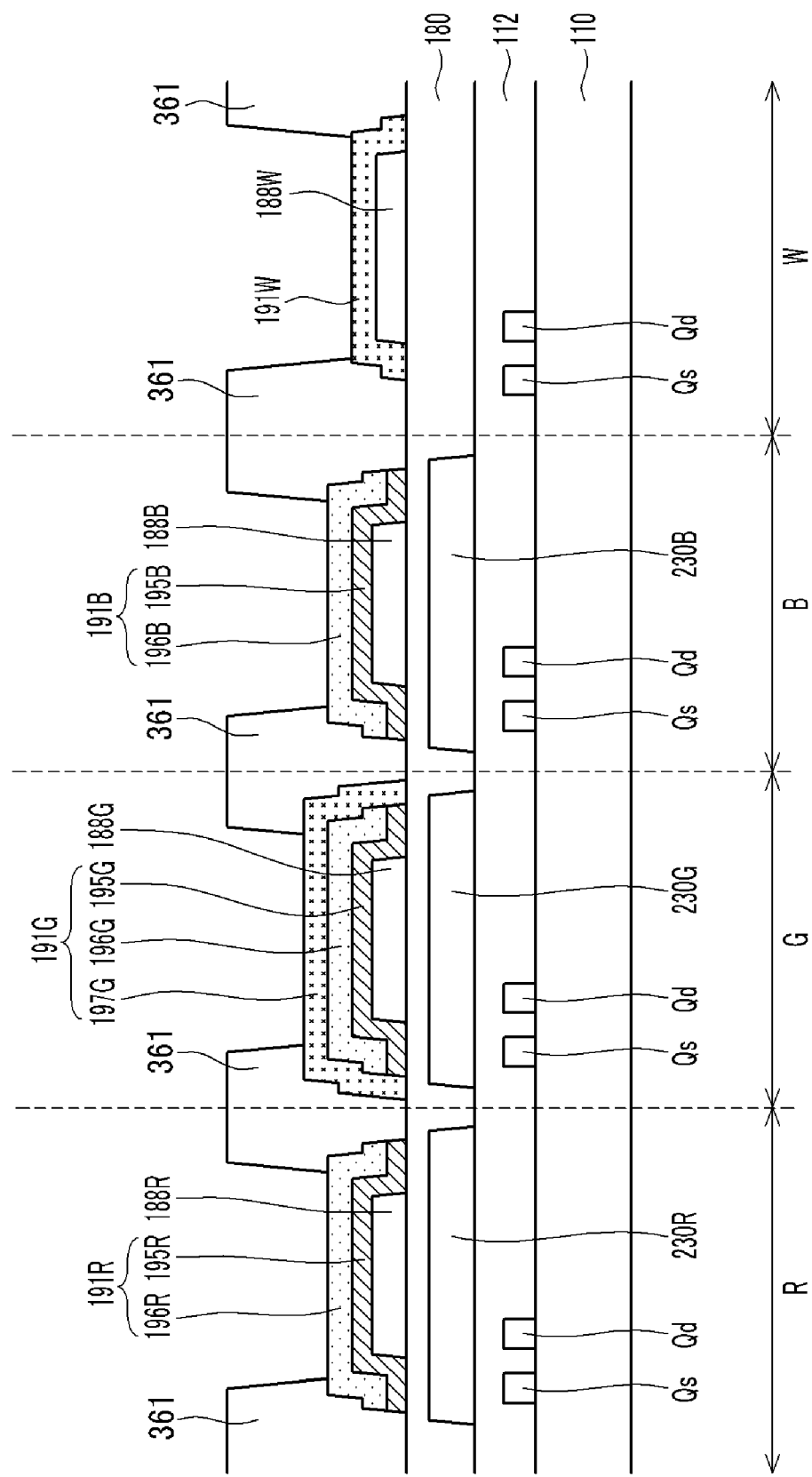

Thereafter, as shown in FIG. 28, an insulating layer (not shown) is coated on the pixel electrodes 191R, 191G, 191B, and 191W and on the overcoat layer 180, and then patterned to form the plurality of insulation members 361 positioned between the pixel electrodes 191R, 191G, 191B, and 191W.

Subsequently, as shown in FIG. 22, the emission layer 370 is formed by sequentially forming a red emission layer (not shown), a blue emission layer (not shown), and a green emission layer (not shown) on the entire surface of the substrate.

Thereafter, the common electrode 270 is formed on the emission layer 370.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising a first pixel, a second pixel, a third pixel, and a white pixel, each of the first pixel, the second pixel, and the third pixel displaying a different color, wherein each pixel comprises:
a first electrode;
a second electrode facing the first electrode; and
an emission layer positioned between the first electrode and the second electrode,
wherein the first electrodes of the first pixel and the second pixel respectively comprise:
a first transparent conductive layer, and
a translucent conductive layer disposed on at least one of a lower portion and an upper portion of the first transparent conductive layer and to form microcavities together with the second electrodes, and
wherein the first electrode of the third pixel comprises:
a second transparent conductive layer that is different from the first transparent conductive layer, and
a translucent conductive layer disposed on at least one of a lower portion and an upper portion of the second transparent conductive layer and to form a microcavity together with the second electrode,
wherein the white pixel comprises:
a first electrode;
a second electrode facing the first electrode; and
an emission layer positioned between the first electrode and the second electrode,
wherein the first electrode of the white pixel comprises the first transparent conductive layer and the second transparent conductive layer.

2. The device of claim 1, wherein the first pixel is a red pixel, the second pixel is a blue pixel, and the third pixel is a green pixel.

3. The device of claim 2, wherein the emission layer comprises a plurality of sub-emission layers, each of which emits light of a different wavelength, and wherein white light is emitted by combining light of the different wavelengths.

4. The device of claim 3, wherein each of the first pixel, the second pixel, and the third pixel further comprise a color filter disposed under the first electrode, respectively.

5. The device of claim 4, wherein the second transparent conductive layer comprises a different etching ratio from that of the first transparent conductive layer and is thicker than the first transparent conductive layer.

6. The device of claim 5, wherein one of the first transparent conductive layer and the second transparent conductive layer comprises crystalline ITO and the other comprises IZO or amorphous ITO.

7. The device of claim 6, wherein the sum of the thickness of the first transparent conductive layer and the thickness of the second transparent conductive layer is within the range of 500 Å to 1500 Å.

8. The device of claim 7, wherein the thickness of the translucent conductive layer is within the range of 100 Å to 400 Å.

9. The device of claim 4, wherein the first transparent conductive layer comprises:
a lower first transparent conductive layer disposed under the translucent conductive layer; and
an upper first transparent conductive layer disposed on the translucent conductive layer.

10. The device of claim 9, wherein the first electrode of the third pixel comprises:
the lower first transparent conductive layer,
the translucent conductive layer disposed on the lower first transparent conductive layer,
the upper first transparent conductive layer disposed on the translucent conductive layer, and
the second transparent conductive layer disposed on the upper first transparent conductive layer.

11. The device of claim 10, wherein the lower first transparent conductive layer and the upper first transparent conductive layers comprise ITO, and the second transparent conductive layer is made of IZO or amorphous ITO.

12. The device of 11, wherein the lower first transparent conductive layer comprises a thickness of 500 Å to 1500 Å.

13. The device of claim 4, further comprising:
auxiliary layers disposed under the first electrode and comprising an insulating material.

14. The device of claim 13, wherein the first pixel, the second pixel, the third pixel, and the white pixel each further comprise:
a thin film transistor (TFT) connected to the first electrode; and
a passivation layer disposed between the TFT and the first electrode,
wherein the passivation layer and the auxiliary layer comprise the same material.

15. The device of claim 14, wherein the passivation layer and the auxiliary layer each comprise silicon nitride (SiNx), silicon oxide ($SiO_2$), or SiON.

16. The device of claim 14, wherein the sum of the thicknesses of the auxiliary layer and the first electrode of the white pixel is within the range of 500 Å to 2000 Å.

17. The device of claim 13, wherein one of the first transparent conductive layer and the second transparent conductive layer comprises crystalline ITO and the other comprises IZO or amorphous ITO.

* * * * *